US012584790B2

(12) United States Patent
Heo et al.

(10) Patent No.: US 12,584,790 B2
(45) Date of Patent: Mar. 24, 2026

(54) SENSOR AND SENSOR ARRAY AND DISPLAY PANEL AND ELECTRONIC DEVICE

(71) Applicant: Samsung Electronics Co., Ltd., Suwon-si (KR)

(72) Inventors: Chul Joon Heo, Suwon-si (KR); Hwijoung Seo, Suwon-si (KR); Sungyoung Yun, Suwon-si (KR); Hyeong-Ju Kim, Suwon-si (KR); Kyung Bae Park, Suwon-si (KR); Feifei Fang, Suwon-si (KR); Younhee Lim, Suwon-si (KR); Tae Jin Choi, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 280 days.

(21) Appl. No.: 18/456,001

(22) Filed: Aug. 25, 2023

(65) Prior Publication Data

US 2024/0159587 A1 May 16, 2024

(30) Foreign Application Priority Data

Oct. 26, 2022 (KR) ........................ 10-2022-0139608

(51) Int. Cl.
*G01J 1/44* (2006.01)
*H10K 39/34* (2023.01)

(52) U.S. Cl.
CPC ................ *G01J 1/44* (2013.01); *H10K 39/34* (2023.02); *G01J 2001/446* (2013.01); *G01J 2001/448* (2013.01)

(58) Field of Classification Search
CPC .. G01J 1/44; G01J 2001/446; G01J 2001/448; H10K 39/34; H10K 59/876;
(Continued)

(56) References Cited

U.S. PATENT DOCUMENTS

| | | | |
|---|---|---|---|
| 8,717,468 | B2 | 5/2014 | Itonaga |
| 8,822,980 | B2 | 9/2014 | Hayashi et al. |

(Continued)

FOREIGN PATENT DOCUMENTS

| | | | |
|---|---|---|---|
| JP | 5563179 | B1 | 7/2014 |
| JP | 2016-152381 | A | 8/2016 |

(Continued)

OTHER PUBLICATIONS

Extended European Search Report dated Mar. 6, 2024 for corresponding European Application No. 23203769.7.

(Continued)

*Primary Examiner* — Georgia Y Epps
*Assistant Examiner* — Monica T Taba
(74) *Attorney, Agent, or Firm* — HARNESS, DICKEY & PIERCE, P.L.C.

(57) ABSTRACT

A sensor may include a reflective electrode, a photoelectric conversion layer on the reflective electrode and including one or more photoelectric conversion materials, a semi-transmissive electrode on the photoelectric conversion layer, a light transmitting buffer layer on the semi-transmissive electrode, and a semi-transmissive auxiliary layer on the light transmitting buffer layer.

20 Claims, 11 Drawing Sheets

(58) Field of Classification Search
CPC .. H10K 65/00; H10K 2102/351; H10K 39/32; H10K 30/81; H10K 30/865; H10K 30/87; H10K 59/90; H10K 30/80; H10K 30/20
See application file for complete search history.

(56) References Cited

U.S. PATENT DOCUMENTS

| | | | | |
|---|---|---|---|---|
| 9,419,157 | B2 | 8/2016 | Izuha et al. | |
| 10,978,523 | B2 | 4/2021 | Park et al. | |
| 11,004,909 | B2 | 5/2021 | Lee et al. | |
| 11,075,341 | B2 | 7/2021 | Yaacobi-Gross | |
| 2018/0102491 | A1 | 4/2018 | Hou et al. | |
| 2020/0227642 | A1* | 7/2020 | Yaacobi-Gross | H10K 85/211 |
| 2020/0235168 | A1* | 7/2020 | Lee | H10K 39/32 |
| 2021/0242271 | A1 | 8/2021 | Park et al. | |
| 2021/0257420 | A1 | 8/2021 | Park et al. | |
| 2022/0140273 | A1* | 5/2022 | Yamazaki | H05B 33/28 257/40 |
| 2022/0261584 | A1 | 8/2022 | Heo et al. | |
| 2025/0008793 | A1* | 1/2025 | Yamazaki | H05B 33/12 |

FOREIGN PATENT DOCUMENTS

| | | | |
|---|---|---|---|
| JP | 2022-125997 | A | 8/2022 |
| KR | 10-2020-0040196 | A | 4/2020 |

OTHER PUBLICATIONS

Marco Furchi et al., “Microcavity-Integrated Graphene Photodetector”, Nano Letters, vol. 12, No. 6, pp. 2773-2777, XP055427968, May 7, 2012.
Yu Yu et al., “Dynamically tunable ultra-narrowband perfect absorbers for the visible-to-infrared range based on a microcavity integrated graphene pair”, Optics Letters, vol. 46, No. 9, p. 2236, XP093134300, Apr. 30, 2021.

* cited by examiner

SENSOR AND SENSOR ARRAY AND DISPLAY PANEL AND ELECTRONIC DEVICE

CROSS-REFERENCE TO RELATED APPLICATION

This application claims priority to and the benefit of Korean Patent Application No. 10-2022-0139608 filed in the Korean Intellectual Property Office on Oct. 26, 2022, the entire contents of which are incorporated herein by reference.

BACKGROUND

(a) Field

Example embodiments of the inventive concepts are directed to sensors, sensor arrays, display panels, and electronic devices.

(b) Description of the Related Art

A photoelectric conversion device is a device absorbing light and converting it to electrical signals and applied to various fields requiring optical properties. Silicon is a representative photoelectric conversion material capable of absorbing light and converting the absorbed light into electrical signals and may exhibit wavelength selectivity, when used with a color filter. The photoelectric conversion device may be used as a sensor due to the photoelectric conversion characteristics and the wavelength selectivity.

SUMMARY

Recently, in order to enhance resolution of the sensor, it is required to integrate as many pixels as possible per unit area. Accordingly, since each pixel becomes smaller and has no sufficient silicon absorption area, there is a limit to realizing high sensitivity. In addition, sufficient wavelength selectivity is difficult to secure due to limitation of light transmission characteristics of the color filter for each wavelength spectrum. On the other hand, in order to replace the silicon and the color filter, an organic material having photoelectric conversion characteristics may be used, but is not easy to design a molecular structure of the organic material to simultaneously satisfy various factors such as wavelength selectivity, process stability, and the like.

Some example embodiments provide a sensor capable of overcoming the material limitations of photoelectric conversion materials and implementing high wavelength selectivity.

Some example embodiments provide a sensor array including the sensor.

Some example embodiments provide a display panel including the sensor or the sensor array.

Some example embodiments provide an electronic device including the sensor, the sensor array, or the display panel.

According to some example embodiments, a sensor includes a reflective electrode, a photoelectric conversion layer on the reflective electrode and including one or more photoelectric conversion materials, a semi-transmissive electrode on the photoelectric conversion layer, a light transmitting buffer layer on the semi-transmissive electrode, and a semi-transmissive auxiliary layer on the light transmitting buffer layer.

The one or more photoelectric conversion materials may include one photoelectric conversion material that is configured to absorb light in a blue to red wavelength spectrum, or a combination of two or more photoelectric conversion materials, the combination configured to absorb light in the blue to red wavelength spectrum. The sensor may be configured to selectively sense light of a first wavelength spectrum that is any one of a blue wavelength spectrum, a green wavelength spectrum, or a red wavelength spectrum.

The first wavelength spectrum may be the blue wavelength spectrum, and a thickness of the photoelectric conversion layer may be about 90 nm to about 120 nm.

A sum of thicknesses of the photoelectric conversion layer and the light transmitting buffer layer may be about 95 nm to about 170 nm.

The first wavelength spectrum may be the green wavelength spectrum, and a thickness of the photoelectric conversion layer may be about 20 nm to about 60 nm.

A sum of thicknesses of the photoelectric conversion layer and the light transmitting buffer layer may be about 25 nm to about 110 nm.

The first wavelength spectrum may be the red wavelength spectrum, and a thickness of the photoelectric conversion layer may be greater than about 60 nm and less than about 90 nm.

A sum of thicknesses of the photoelectric conversion layer and the light transmitting buffer layer may be greater than about 65 nm and less than about 140 nm.

The light transmitting buffer layer may be non-conductive and may be configured to not absorb light in a visible light wavelength spectrum, and refractive indices of the light transmitting buffer layer at 450 nm, 530 nm, and 630 nm may be about 1.3 to about 2.0, respectively.

A thickness of the light transmitting buffer layer may be about 5 nm to about 50 nm, and the semi-transmissive electrode and the semi-transmissive auxiliary layer may each independently include a metal layer having a light transmittance of about 10% to about 70% and a reflectance of about 30% to about 80%.

According to some example embodiments, a sensor array may include the sensor.

According to some example embodiments, a sensor array includes a first sensor configured to selectively sense light in a blue wavelength spectrum, a second sensor configured to selectively sense light in a green wavelength spectrum and a third sensor configured to selectively sense light in a red wavelength spectrum, wherein the first sensor, the second sensor, and the third sensor each include a reflective electrode, a photoelectric conversion layer on the reflective electrode, a semi-transmissive electrode on the photoelectric conversion layer, a light transmitting buffer layer on the semi-transmissive electrode, and the a semi-transmissive auxiliary layer on the light transmitting buffer layer, and the photoelectric conversion layer of the first sensor, the photoelectric conversion layer of the second sensor, and the photoelectric conversion layer of the third sensor have different thicknesses from each other.

The photoelectric conversion layer of the first sensor may be thicker than the photoelectric conversion layer of the third sensor, and the photoelectric conversion layer of the third sensor may be thicker than the photoelectric conversion layer of the second sensor.

The thickness of the photoelectric conversion layer of the first sensor may be about 90 nm to about 120 nm, the thickness of the photoelectric conversion layer of the second sensor may be about 20 nm to about 60 nm, and the thickness of the photoelectric conversion layer of the third sensor may be greater than about 60 nm and less than about 90 nm.

A sum of thicknesses of the photoelectric conversion layer and the light transmitting buffer layer of the first sensor may be about 95 nm to 170 nm, and a sum of thicknesses of the photoelectric conversion layer and the light transmitting buffer layer of the second sensor may be about 25 nm to 110 nm, and a sum of the thicknesses of the photoelectric conversion layer and the light transmitting buffer layer of the third sensor may be greater than about 65 nm and less than 140 nm.

Each of the photoelectric conversion layers of the first sensor, the second sensor, and the third sensor may include one or more photoelectric conversion materials. The one or more photoelectric conversion materials may include one photoelectric conversion material that is configured to absorb light in a blue to red wavelength spectrum, or a combination of two or more photoelectric conversion materials, the combination configured to absorb light in the blue to red wavelength spectrum.

According to some example embodiments, a sensor array includes a first sensor, a second sensor, and a third sensor which are repeatedly arranged on a substrate, wherein the first sensor, the second sensor, and the third sensor each include a photoelectric conversion layer configured to absorb light in a blue to red wavelength spectrum, the first sensor, the second sensor, and the third sensor each do not include any color filter, the first sensor is configured to selectively sense light in a blue wavelength spectrum, the second sensor is configured to selectively sense light in a green wavelength spectrum, and the third sensor is configured to selectively sense light in a red wavelength spectrum, and each full width at half maximum of EQEs of the first sensor, the second sensor, and the third sensor is about 10 nm to about 70 nm.

The first sensor, the second sensor, and the third sensor may each further include a reflective electrode under the photoelectric conversion layer, and a semi-transmissive electrode on the photoelectric conversion layer, a light transmitting buffer layer and a semi-transmissive auxiliary layer, wherein the photoelectric conversion layer of the first sensor may be thicker than the photoelectric conversion layer of the third sensor, the photoelectric conversion layer of the third sensor may be thicker than the photoelectric conversion layer of the second sensor, a sum of thicknesses of the photoelectric conversion layer of the first sensor and the light transmitting buffer layer of the first sensor may be about 95 nm to about 170 nm, a sum of thicknesses of the photoelectric conversion layer of the second sensor and the light transmitting buffer layer of the second sensor may be about 25 nm to about 110 nm, and a sum of thicknesses of the photoelectric conversion layer of the third sensor and the light transmitting buffer layer of the third sensor may be greater than about 65 nm and less than 140 nm.

According to some example embodiments, a display panel includes the sensor array and a light emitting element array, the light emitting element array including a light emitting element configured to display blue light, a light emitting element configured to display green light, and a light emitting element configured to display red light.

According to some example embodiments, an electronic device may include the sensor array.

The material limitations of photoelectric conversion materials may be overcome and a sensor with high wavelength selectivity may be realized.

DETAILED DESCRIPTION

Figure 1:
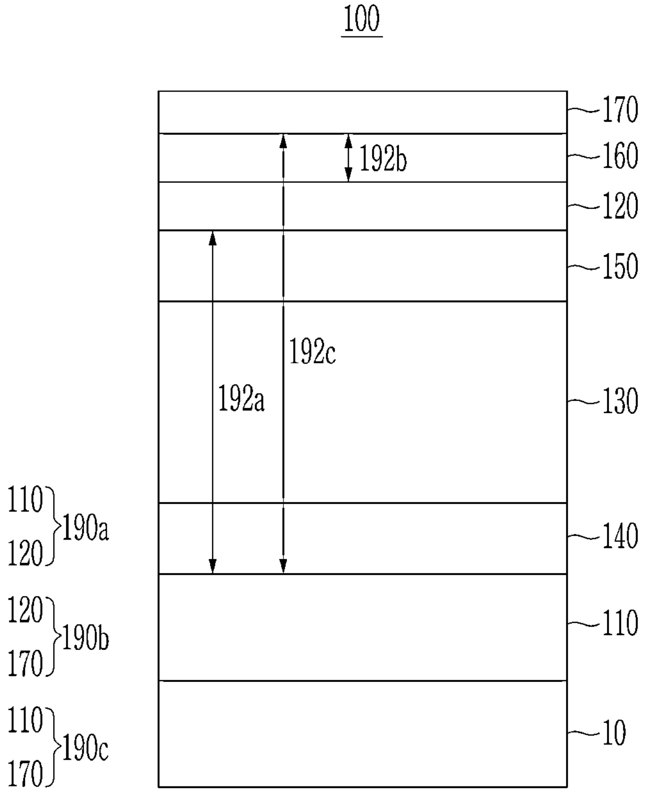
FIG. 1 is a cross-sectional view showing an example of a sensor according to some example embodiments.

Hereinafter, some example embodiments will be described in detail so that a person skilled in the art would understand the inventive concepts. However, a structure that is actually applied according to some example embodiments may be implemented in various different forms and is not limited to the example embodiments described herein.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be present. In contrast, when an element is referred to as being "directly on" another element, there are no intervening elements present.

In the drawings, parts having no relationship with the description are omitted for clarity of some example embodiments, and the same or similar constituent elements are indicated by the same reference numeral throughout the specification.

Hereinafter, the terms "lower" or "under" and "upper" or "on" only express relative positions, but do not limit absolute location relationship.

Hereinafter, when a definition is not otherwise provided, the energy level is the highest occupied molecular orbital (HOMO) energy level or the lowest unoccupied molecular orbital (LUMO) energy level.

Hereinafter, when a definition is not otherwise provided, a work function or an energy level is expressed as an absolute value from a vacuum level. In addition, when the work function or the energy level is referred to be deep, high, or large, it may have a large absolute value based on "0 eV" of the vacuum level while when the work function or the energy level is referred to be shallow, low, or small, it may have a small absolute value based on "0 eV" of the vacuum level. Further, the differences between the work function and/or the energy level may be values obtained by subtracting a small value of the absolute value from a large value of the absolute value.

Hereinafter, when a definition is not otherwise provided, the HOMO energy level may be evaluated with an amount of photoelectrons emitted by energy when irradiating UV light to a thin film using AC-2 (Hitachi) or AC-3 (Riken Keiki Co., Ltd.).

Hereinafter, when a definition is not otherwise provided, the LUMO energy level may be obtained by obtaining an energy bandgap using a UV-Vis spectrometer (Shimadzu Corporation), and then calculating the LUMO energy level from the energy bandgap and the already measured HOMO energy level.

It will further be understood that when an element is referred to as being "on" another element, it may be above or beneath or adjacent (e.g., horizontally adjacent) to the other element. It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof. Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%). Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%). Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%). It will be understood that elements and/or properties thereof may be recited herein as being "identical" to, "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof. While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%). When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the inventive concepts. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, a sensor according to some example embodiments will be described.

A sensor according to some example embodiments may be an optical sensor capable of receiving light and converting the light into an electrical signal. A sensor according to some example embodiments may be an organic sensor including an organic compound as a photoelectric conversion material. The sensor according to some example embodiments may be a color sensor configured to selectively sense a portion of the visible light wavelength spectrum.

FIG. 1 is a cross-sectional view showing an example of a sensor according to some example embodiments.

Referring to FIG. 1, a sensor 100 according to some example embodiments includes a reflective electrode 110 on a substrate 10, a semi-transmissive electrode 120 facing the reflective electrode 110, and a photoelectric conversion layer 130 and optionally first and second charge auxiliary layers 140 and 150 between the reflective electrode 110 and the semi-transmissive electrode 120, a light transmitting buffer layer 160 on the semi-transmissive electrode 120, and a semi-transmissive auxiliary layer 170 on the light transmitting buffer layer 160.

The substrate 10 may be disposed under the reflective electrode 110 to support the sensor 100 and optionally provide a circuit necessary for driving or operating the sensor 100. The substrate 10 may be, for example, an inorganic substrate such as a glass plate or a silicon wafer, or a polymer substrate made of an organic material. The substrate 10 may be omitted.

The substrate 10 may be, for example, a semiconductor substrate, or for example, a silicon substrate. The semiconductor substrate may include a circuit unit (not shown), and the circuit unit may include transmission transistors (not shown) and/or charge storage (not shown) integrated in the semiconductor substrate. The circuit unit may be electrically connected to the reflective electrode 110 or the semi-transmissive electrode 120.

The substrate 10 may be, for example, a glass plate or a polymer substrate. The polymer substrate may include, for example, polycarbonate, polymethylmethacrylate, polyethyleneterephthalate, polyethylenenaphthalate, polyimide, polyamide, polyamideimide, polyethersulfone, polyorganosiloxane, styrene-ethylene-butylene-styrene, polyurethane, polyacrylate, polyolefin, or any combination thereof, but is not limited thereto.

The substrate 10 may be, for example, a thin film transistor substrate or a thin film transistor backplane in which a plurality of thin film transistors (TFTs) are arranged on a glass plate or a polymer substrate.

One of the reflective electrode 110 or the semi-transmissive electrode 120 may be an anode and the other may be a cathode. For example, the reflective electrode 110 may be an anode and the semi-transmissive electrode 120 may be a cathode. For example, the reflective electrode 110 may be a cathode and the semi-transmissive electrode 120 may be an anode. Light may pass through the semi-transmissive electrode 120, and the semi-transmissive electrode 120 may be an incident electrode or a light-receiving electrode on a side where light is incident.

The reflective electrode 110 may include a reflective layer capable of ideally reflecting all light (e.g., all incident light), and the reflective layer may have, for example, a light transmittance of about 0% to about 5% and/or a reflectance of about 80% to about 100%. Herein, the light transmittance and reflectance may be average light transmittance and average reflectance in the visible light wavelength spectrum (e.g., greater than or equal to about 380 nm and less than about 750 nm).

The reflective layer may include an optically opaque material, such as a metal, a metal nitride, or any combination thereof, for example silver (Ag), copper (Cu), aluminum (Al), gold (Au), titanium (Ti), chromium (Cr), nickel (Ni), an alloy thereof, a nitride thereof (e.g., TiN), or any combination thereof, but is not limited thereto.

The reflective electrode 110 may be formed of a reflective layer or may have a stacked structure of a reflective layer/light transmitting layer or a light transmitting layer/reflective layer/light transmitting layer, and the reflective layer may have one layer or two or more layers. The light transmitting layer may have a light transmittance of greater than or equal to about 85%, and may be, for example, an oxide conductor such as indium tin oxide (ITO), indium zinc oxide (IZO), zinc tin oxide (ZTO), or aluminum tin oxide (aluminum tin oxide, ATO), and aluminum zinc oxide (AZO), but is not limited thereto.

The semi-transmissive electrode 120 may include a semi-transmissive layer configured to transmit some of the light (e.g., incident light) and reflect some of the light. The semi-transmissive layer may have a light transmittance of, for example, about 20% to about 70%, about 30% to about 70%, about 20% to about 60%, about 30% to about 60%, about 20% to about 50% or about 30% to about 50%, and a reflectance of about 30% to about 80%, about 30% to about 70%, about 30% to about 60%, about 40% to about 80%, about 40% to about 70%, or about 40% to about 60%. Herein, the light transmittance and reflectance may be average light transmittance and average reflectance in the visible light wavelength spectrum (e.g., greater than or equal to about 380 nm and less than about 750 nm).

The semi-transmissive layer may be a very thin metal layer, for example several nanometers to several tens of nanometers. A thickness of the metal layer may be, for example, about 2 nm to about 50 nm, about 2 nm to about 40 nm, about 2 nm to about 30 nm, about 2 nm to about 25 nm, about 2 nm to about 20 nm, about 2 nm to about 15 nm, about 5 nm to about 50 nm, about 5 nm to about 40 nm, about 5 nm to about 30 nm, about 5 nm to about 25 nm, about 5 nm to about 20 nm, or about 5 nm to about 15 nm, and with the thickness, the aforementioned effective semi-transmission characteristics of light transmittance and reflectance may be exhibited. The semi-transmissive layer may be, for example, formed to a very thin thickness as described above, with aluminum (Al), magnesium (Mg), silver (Ag), gold (Au), magnesium-silver (Mg—Ag), magnesium-aluminum (Mg—Al), an alloy thereof, or any combination thereof, but is not limited thereto.

The semi-transmissive electrode 120 may be formed of a semi-transmissive layer or may have a stacked structure of a semi-transmissive layer/a light transmitting layer or a light transmitting layer/a semi-transmissive layer/a light transmitting layer, and the semi-transmissive layer may have one layer or two or more layers. The light transmitting layer is as described above.

The photoelectric conversion layer 130 may be disposed on the reflective electrode 110 and may be configured to absorb light (e.g., incident light) in a visible light wavelength spectrum (e.g., an entirety of the visible light wavelength spectrum) and convert the absorbed light into an electrical signal. The visible light wavelength spectrum may include blue to red wavelength spectra, and may be, for example, greater than about 380 nm and less than about 750 nm, and may be about 380 nm to about 700 nm, or about 400 nm to about 700 nm within the above range. For example, the photoelectric conversion layer 130 may not have wavelength selectivity in the visible light wavelength spectrum.

The photoelectric conversion layer 130 may include (e.g., may be partially or completely formed of) one or more photoelectric conversion materials configured to absorb light and convert the absorbed light into an electrical signal. The one or more photoelectric conversion materials may include an organic photoelectric conversion material, an inorganic photoelectric conversion material, an organic/inorganic photoelectric conversion material, or any combination thereof, for example, at least a portion of the one or more photoelectric conversion materials may be an organic photoelectric conversion material. The organic photoelectric conversion material may be a non-polymer or a polymer, and may be, for example, a low-molecular compound capable of being deposited.

One photoelectric conversion material or a combination of two or more photoelectric conversion materials (e.g., the one or more photoelectric conversion materials) may be configured to absorb and photoelectrically convert light of a blue to red wavelength spectrum, that is, a visible light wavelength spectrum (greater than or equal to about 380 nm and less than about 750 nm). For example, the one or more photoelectric conversion materials of the photoelectric conversion layer 130 may include one photoelectric conversion material that is configured to absorb light in a blue to red wavelength spectrum, or a combination of two or more photoelectric conversion materials, where the combination is configured (e.g., collectively configured) to absorb light in the blue to red wavelength spectrum. In some example embodiments, the one or more photoelectric conversion materials that are configured to absorb light in a blue to red wavelength spectrum may not have wavelength selectivity within the visible light wavelength spectrum. The one or more photoelectric conversion materials that are configured to absorb light in a blue to red wavelength spectrum may, in some example embodiments, constitute an entirety of photoelectric conversion materials included in the photoelectric conversion layer 130, such that the photoelectric conversion layer 130 may be configured to absorb and photoelectrically convert light of a blue to red wavelength spectrum and may not have wavelength selectivity in the visible light wavelength spectrum. It will be understood herein that one or more photoelectric conversion materials that are configured to absorb light in a blue to red wavelength spectrum may include one photoelectric conversion material that is configured to absorb light in a blue to red wavelength spectrum and thus to not have wavelength selectivity in the visible light wavelength spectrum or a combination of two or more photoelectric conversion materials that is configured (e.g., the combination is collectively configured) to absorb light in the blue to red wavelength spectrum and thus to not have wavelength selectivity in the visible light wavelength spectrum.

For example, the photoelectric conversion layer 130 may include one photoelectric conversion material, and the one photoelectric conversion material may be configured to absorb light in a blue to red wavelength spectrum. Examples of such a photoelectric conversion material may include perylene diimide, fullerene such as C60 or C70, or a fullerene derivative.

For example, the photoelectric conversion layer 130 may include two or more photoelectric conversion materials, and the two or more photoelectric conversion materials may be configured (e.g., collectively configured) to absorb light in a blue to red wavelength spectrum by combining the two or more photoelectric conversion materials. For example, the two or more photoelectric conversion materials may include a first photoelectric conversion material configured to absorb light of a relatively short wavelength spectrum (e.g., including a blue wavelength spectrum) of the visible light wavelength spectrum, a second photoelectric conversion material configured to absorb light of a relatively middle wavelength spectrum (e.g., including a green wavelength spectrum) of the visible light wavelength spectrum, and a third photoelectric conversion material configured to absorb light of a relatively long wavelength spectrum (e.g., including a red wavelength spectrum) in the visible light wavelength spectrum.

Examples of the first photoelectric conversion material may include fullerene such as C60 and C70 or a derivative thereof, but the first photoelectric conversion material is not particularly limited as long as it is a material capable of absorbing light in a relatively short wavelength region (e.g., blue wavelength spectrum) of the visible light wavelength spectrum.

Examples of the second photoelectric conversion material may include thiophene or a thiophene derivative; subphthalocyanine or a derivative thereof; BODIPY or a derivative thereof; or an organic material with a D-A core structure including an electron donating moiety (D) containing a chalcogen element such as thiophene, selenophene, and/or tellurophene and including an electron accepting moiety (A) containing C═O, C═S, C═Se, C═Te, or $C{=}C(CN)_2$ in a ring, but the second photoelectric conversion material is not particularly limited as long as it is a material capable of absorbing light in a relatively medium wavelength region (e.g., green wavelength spectrum) of the visible light wavelength spectrum.

Examples of the third photoelectric conversion material may include metal phthalocyanine, metal oxide phthalocyanine, or a derivative thereof, such as copper phthalocyanine, zinc phthalocyanine, titanyl phthalocyanine, or a derivative thereof, but the third photoelectric conversion material is not particularly limited as long as a material capable of absorbing light in a relatively long wavelength region (e.g., red wavelength spectrum) of the visible light wavelength spectrum.

That is, the one or more photoelectric conversion materials included in the photoelectric conversion layer 130 alone or in combination may be configured to absorb light of a blue to red wavelength spectrum (e.g., greater than or equal to about 380 nm and less than about 750 nm, desirably about 380 nm to about 700 nm, or about 400 nm to about 700 nm) and photoelectrically convert the absorbed light and may not have wavelength selectivity within the visible light wavelength spectrum. The one or more photoelectric conversion materials that are configured to absorb light of a blue to red wavelength spectrum and to photoelectrically convert the absorbed light and to not have wavelength selectivity within the visible light wavelength spectrum may constitute an entirety of photoelectric conversion materials included in the photoelectric conversion layer 130, such that the photoelectric conversion layer 130 is configured to absorb light of a blue to red wavelength spectrum and to photoelectrically convert the absorbed light and to not have wavelength selectivity within the visible light wavelength spectrum. For example, the one or more photoelectric conversion materials may include one photoelectric conversion material that does not have wavelength selectivity within the visible light wavelength spectrum and thus is configured to absorb all or substantially all of the visible light wavelength spectrum of incident light, such that the photoelectric conversion layer 130 does not have wavelength selectivity within the visible light wavelength spectrum and thus is configured to absorb all or substantially all of the visible light wavelength spectrum of incident light. For example, the one or more photoelectric conversion materials may include a combination of two or more photoelectric conversion materials, where the combination does not have wavelength selectivity within the visible light wavelength spectrum and thus the combination is configured to absorb all or substantially all of the visible light wavelength spectrum of incident light, such that the photoelectric conversion layer 130 does not have wavelength selectivity within the visible light wavelength spectrum and thus is configured to absorb all or substantially all of the visible light wavelength spectrum of incident light. Accordingly, the one or more photoelectric conversion materials are not particularly limited as long as the one or more photoelectric conversion materials included in the photoelectric conversion layer 130 are capable of absorbing light within the visible light wavelength spectrum, and selection of materials may be widened without limitation of wavelength selectivity.

The one or more photoelectric conversion materials may include a p-type semiconductor and/or an n-type semiconductor. The p-type semiconductor and n-type semiconductor may form a pn junction, and after generating excitons by receiving light from the outside, the generated excitons may be separated into holes and electrons. At least one of the p-type semiconductor or the n-type semiconductor may be the aforementioned one or more photoelectric conversion materials. For example, each of the p-type semiconductor and the n-type semiconductor may be the aforementioned one or more photoelectric conversion materials. For example, the p-type semiconductor may be the aforementioned one or more photoelectric conversion materials, and the n-type semiconductor may be a counter material that does not absorb light in a visible light wavelength spectrum. For example, the n-type semiconductor may be the aforementioned one or more photoelectric conversion materials, and the p-type semiconductor may be a counter material that does not absorb light in a visible light wavelength spectrum.

The photoelectric conversion layer 130 may be a mixed layer in which a p-type semiconductor and an n-type semiconductor are mixed, or a bilayer including a p-layer including a p-type semiconductor and an n-layer including an n-type semiconductor, or a triple layer including a p-layer including a p-type semiconductor, a mixed layer in which a p-type semiconductor and an n-type semiconductor are mixed, and an n-layer including an n-type semiconductor, but is not limited thereto.

A thickness of the photoelectric conversion layer 130 may vary according to a wavelength spectrum to be sensed by the sensor 100. For example, the sensor 100 may be a blue sensor configured to selectively sense light in a blue wavelength spectrum, a green sensor configured to selectively sense light in a green wavelength spectrum, or a red sensor configured to selectively sense light in a red wavelength spectrum, and the photoelectric conversion layers 130 of the blue sensor, the green sensor, and the red sensor may have different thicknesses from each other. This will be described later.

For example, the photoelectric conversion layer 130 of the blue sensor may be thicker than the photoelectric conversion layer 130 of the red sensor and the photoelectric conversion layer 130 of the green sensor, and the photoelectric conversion layer 130 of the red sensor may be thicker than the photoelectric conversion layer 130 of the green sensor.

For example, when the sensor 100 is a blue sensor, a thickness of the photoelectric conversion layer 130 may be about 90 nm to about 120 nm.

For example, when the sensor 100 is a green sensor, a thickness of the photoelectric conversion layer 130 may be about 20 nm to about 60 nm.

For example, when the sensor 100 is a red sensor, a thickness of the photoelectric conversion layer 130 may be greater than about 60 nm and less than about 90 nm.

In some example embodiments, the photoelectric conversion layer 130 may be formed of (e.g., may entirely comprise) one or more photoelectric conversion materials that are, alone or collectively, configured to absorb light in a red to blue wavelength spectrum such that the photoelectric conversion layer 130 is configured to absorb and photoelectrically convert incident light in the red to blue wavelength spectrum and has no wavelength selectivity in the visible light wavelength spectrum. However, example embodiments are not limited thereto. For example, in some example embodiments, the photoelectric conversion layer 130 may include a combination (e.g., a mixture) of the one or more photoelectric conversion materials that are configured to absorb light in a red to blue wavelength spectrum and one or more additional materials which may be configured to not absorb and photoelectrically convert incident light, such that the photoelectric conversion layer 130 that includes the combination of the one or more photoelectric conversion materials and one or more additional materials may be configured to absorb and photoelectrically convert light in the red to blue wavelength spectrum and may not have wavelength selectivity in the visible light wavelength spectrum, while the one or more photoelectric conversion materials comprise a limited portion of the photoelectric conversion layer 130. The one or more additional materials may be one or more materials that are configured to not photoelectrically convert incident light. The one or more additional materials may include one or more inert materials, one or more buffer materials, or the like. In some example embodiments, the one or more additional materials may include an acrylic resin, a (meth)acrylic resin, polyisoprene, a vinyl resin, an epoxy resin, a urethane resin, a cellulose resin, a perylene resin, or any combination thereof, but example embodiments are not limited thereto.

The first and second charge auxiliary layers 140 and 150 may be between the reflective electrode 110 and the photoelectric conversion layer 130 and between the semi-transmissive electrode 120 and the photoelectric conversion layer 130 to control the mobility of holes and/or electrons separated from the photoelectric conversion layer 130. The first and second charge auxiliary layers 140 and 150 may each independently include an organic material, an inorganic material, and/or an organic-inorganic material. The first and second charge auxiliary layers 140 and 150 may include, for example, one or more of a hole injecting layer HIL, a hole transporting layer HTL, an electron blocking layer EBL, an electron injecting layer EIL, an electron transporting layer ETL, and a hole blocking layer HBL, but are not limited thereto.

The hole injecting layer, the hole transporting layer, and/or the electron blocking layer may include, for example, a phthalocyanine compound such as copper phthalocyanine; DNTPD (N,N'-diphenyl-N,N'-bis-[4-(phenyl-m-tolyl-amino)-phenyl]-biphenyl-4,4'-diamine), m-MTDATA (4,4', 4"-[tris(3-methylphenyl)phenylamino] triphenylamine), TDATA (4,4'4"-tris(N,N-diphenylamino)triphenylamine), 2-TNATA (4,4',4"-tris{N,N-(2-naphthyl)-N-phenylamino}-triphenylamine), PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/Camphor sulfonic acid), PANI/PSS (polyaniline/poly(4-styrenesulfonate)), NPB (N,N'-di(naphthalene-1-yl)-N,N'-diphenylbenzidine), polyetherketone including triphenylamine (TPAPEK), 4-isopropyl-4'-methyldiphenyliodonium[tetrakis(pentafluorophenyl)borate], HAT-CN (dipyrazino[2,3-f: 2',3'-h] quinoxaline-2,3,6,7,10,11-hexacarbonitrile), a carbazole-based derivative such as N-phenylcarbazole, polyvinylcarbazole, and the like, a fluorene-based derivative, TPD (N,N'-bis(3-methylphenyl)-N,N'-diphenyl-[1,1-biphenyl]-4,4'-diamine), a triphenylamine-based derivative such as TCTA (4,4',4"-tris(N-carbazolyl)triphenylamine), NPB (N,N'-di(naphthalene-1-yl)-N,N'-diphenyl-benzidine), TAPC (4,4'-cyclohexylidene bis[N,N-bis(4-methylphenyl)benzenamine]), HMTPD (4,4'-bis[N,N'-(3-tolyl)amino]-3,3'-dimethylbiphenyl), mCP (1,3-bis(N-carbazolyl)benzene), or any combination thereof, but are not limited thereto.

The electron injecting layer, the electron transporting layer, and/or the hole blocking layer may be, for example, a halogenated metal such as LiF, NaCl, CsF, RbCl, and RbI; a lanthanide metal such as Yb; a metal such as calcium (Ca), potassium (K), aluminum (Al), or an alloy thereof; a metal oxide such as $Li_2O$ or BaO; Liq (lithium quinolate), Alq 3 (tris(8-hydroxyquinolinato)aluminum), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, TPBi (1,3,5-tri(1-phenyl-1H-benzo[d]imidazol-2-yl)phenyl), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tertbutylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1, O8)-(1,1'-biphenyl-4-olato)aluminum), $Bebq_2$ (berylliumbis (benzoquinolin-10-olate), ADN (9,10-di(naphthalene-2-yl) anthracene), BmPyPhB (1,3-bis[3,5-di(pyridin-3-yl)phenyl] benzene), or any combination thereof, but are not limited thereto.

At least one of the first or second charge auxiliary layers 140 or 150 may be omitted.

The light transmitting buffer layer 160 is disposed on the semi-transmissive electrode 120. The light transmitting buffer layer 160 may not substantially absorb light in the visible light wavelength spectrum (e.g., may be configured to not absorb any light or substantially any light in the visible light wavelength spectrum) and may have non-conductivity (e.g., insulation properties), and thus may be non-conductive (e.g., electrically non-conductive). Accordingly, the light transmitting buffer layer 160 may not substantially affect light entering the photoelectric conversion layer 130 (e.g., light that is incident on the photoelectric conversion layer 130 through the light transmitting buffer layer 160) and may not substantially affect electrical characteristics of the reflective electrode 110 and the semi-transmissive electrode 120.

The light transmitting buffer layer 160 may have a relatively high refractive index in the visible light wavelength spectrum, and may have a refractive index of, for example, about 1.3 to about 2.0 at a blue wavelength (e.g., about 450 nm), a green wavelength (e.g., about 530 nm), and a red wavelength (e.g., about 630 nm). For example, a refractive index of the light transmitting buffer layer 160 may be about 1.3 to about 2.0 at each of 450 nm, 530 nm, and 630 nm. The light transmitting buffer layer 160 may have a refractive index of about 1.4 to about 1.9 or about 1.5 to about 1.8 within the above range. Since the light transmitting buffer layer 160 has the refractive index, it is possible to effectively implement microcavity described later in the blue to red wavelength spectrum, and at the same time, to effectively reduce or prevent loss of light during microcavity.

The light transmitting buffer layer 160 may include an organic material, an inorganic material, an organic-inorganic material, or any combination thereof satisfying the refractive index, and may include, for example, BCP (2,9-dimethyl-4,7-diphenyl-1,10-phenanthroline), Bphen (4,7-diphenyl-1,10-phenanthroline), NBphen (2,9-dinaphthalen-2-yl-4,7-diphenyl-1,10-phenanthroline), TAPC (4,4'-cyclohexylidene bis[N,N-bis(4-methylphenyl)benzenamine]), NPB (N,N'-di (naphthalene-1-yl)-N,N'-diphenylbenzidine), TPD (N,N'-bis (3-methylphenyl)-N,N'-diphenyl-[1,1-biphenyl]-4,4'-diamine), and the like, but is not limited thereto.

A thickness of the light transmitting buffer layer 160 may be the same or different depending on the wavelength spectrum to be sensed by the sensor 100.

For example, the sensor 100 may be a blue sensor configured to selectively sense light in a blue wavelength spectrum, a green sensor configured to selectively sense light in a green wavelength spectrum, or a red sensor configured to selectively sense light in a red wavelength spectrum, and the thicknesses of the light transmitting buffer layers 160 in the blue sensor, the green sensor and the red sensor may be the same as or different from each other. In each blue sensor, green sensor, or red sensor, the light transmitting buffer layer 160 may be thinner than the photoelectric conversion layer 130. A thickness of the light transmitting buffer layer 160 may be about 5 nm to about 50 nm, for example, within the above range, about 5 nm to about 45 nm, about 5 nm to about 40 nm, about 5 nm to about 35 nm, about 5 nm to about 30 nm, about 10 nm to about 50 nm, and about 10 nm to about 45 nm, about 10 nm to about 40 nm, about 10 nm to about 35 nm, or about 10 nm to about 30 nm.

The semi-transmissive auxiliary layer 170 may be disposed on the light transmitting buffer layer 160 and may face the semi-transmissive electrode 120 with the light transmitting buffer layer 160 interposed therebetween. The semi-transmissive auxiliary layer 170 may be configured to transmit some of the light and reflect some of the light, and may have a light transmittance of, for example about 20% to about 70%, about 30% to about 70%, about 20% to about 60%, about 30% to about 60%, about 20% to about 50%, or about 30% to about 50% and a reflectance of about 30% to about 80%, about 30% to about 70%, about 30% to about 60%, about 40% to about 80%, about 40% to about 70%, or about 40% to about 60%.

The semi-transmissive auxiliary layer 170 may be, for example, a very thin metal layer of several nanometers to several tens of nanometers. A thickness of the metal layer may be, for example, about 2 nm to about 50 nm, about 2 nm to about 40 nm, about 2 nm to about 30 nm, about 2 nm to about 25 nm, about 2 nm to about 20 nm, about 2 nm to about 15 nm, about 5 nm to about 50 nm, about 5 nm to about 40 nm, about 5 nm to about 30 nm, about 5 nm to about 25 nm, about 5 nm to about 20 nm, or about 5 nm to about 15 nm, and with the thickness, the aforementioned effective semi-transmission characteristics of light transmittance and reflectance may be exhibited. The semi-transmissive auxiliary layer 170 may be, for example, formed to a very thin thickness as described above, with aluminum (Al), magnesium (Mg), silver (Ag), gold (Au), magnesium-silver (Mg—Ag), magnesium-aluminum (Mg—Al), an alloy thereof, or any combination thereof, but is not limited thereto. For example, the semi-transmissive auxiliary layer 170 and the semi-transmissive electrode 120 may include the same or different metal layers with the same or different thicknesses.

The sensor 100 may further include an antireflection layer (not shown) and/or an encapsulant (not shown) on the semi-transmissive auxiliary layer 170.

As described above, the sensor 100 has a structure in which the reflective electrode 110 and the semi-transmissive electrode 120 face each other with the photoelectric conversion layer 130 therebetween, and the semi-transmissive electrode 120 and the semi-transmissive auxiliary layer 170 face each other with the light transmitting buffer layer 160 therebetween. In addition, the sensor 100 has a structure in which the reflective electrode 110 and the semi-transmissive auxiliary layer 170 face each other with several layers including the photoelectric conversion layer 130 and the light transmitting buffer layer 160 therebetween.

In this way, the sensor 100 may form (e.g., define) a plurality of microcavity structures by including the reflective electrode 110, the semi-transmissive electrode 120, and the semi-transmissive auxiliary layer 170 facing each other. That is, the sensor 100 may form a microcavity structure (hereinafter referred to as a 'first microcavity structure' 190*a*) by the reflective electrode 110 and the semi-transmissive electrode 120 facing each other, another microcavity structure (hereinafter referred to as 'second microcavity structure' 190*b*) by the semi-transmissive electrode 120 and the semi-transmissive auxiliary layer 170 facing each other, and yet another microcavity structure (hereinafter referred to as 'third microcavity structure' 190*c*) by the semi-transmissive auxiliary layer 170 and the reflective electrode 110 facing each other. The inner surfaces of the reflective electrode 110, the semi-transmissive electrode 120, and the semi-transmissive auxiliary layer 170 facing each other (e.g., the opposing surfaces of the reflective electrode 110 and the semi-transmissive electrode 120, the opposing surfaces of the semi-transmissive electrode 120 and the semi-transmissive auxiliary layer 170, and the opposing surfaces of the reflective electrode 110 and the semi-transmissive auxiliary layer 170) may be mirror surfaces configured to reflect light, and for example, the mirror surfaces may be configured to reflect at least a portion of the visible light wavelength spectrum.

By the first microcavity structure 190 a, the light incident through the semi-transmissive electrode 120 may be repeatedly reflected between the reflective electrode 110 (reflective layer) and the semi-transmissive electrode 120 (semi-transmissive layer) separated by a particular (or, alternatively, predetermined) optical path length 192 a to cause resonance and light of a particular (or, alternatively, predetermined) wavelength spectrum may be enhanced by this resonance. The particular (or, alternatively, predetermined) wavelength spectrum may include a resonance wavelength of the first microcavity structure 190 a and the resonance wavelength may be enhanced to exhibit photoelectric conversion characteristics amplified in a portion of the wavelength spectrum (hereinafter referred to as 'first wavelength spectrum') of the visible light wavelength spectrum. The resonance wavelength may be a wavelength belonging to a blue wavelength spectrum, a green wavelength spectrum, or a red wavelength spectrum, and the first wavelength spectrum may be any one of a blue wavelength spectrum, a green wavelength spectrum, or a red wavelength spectrum.

The resonance wavelength may be determined according to the optical path length 192*a*, which is a distance between the reflective layer of the reflective electrode 110 and the semi-transmissive layer of the semi-transmissive electrode 120. The optical path length 192*a* may be determined, for example, by the sum of the thicknesses of the photoelectric conversion layer 130 and the charge auxiliary layers 140 and 150, and when the charge auxiliary layers 140 and 150 are omitted or the thicknesses of the charge auxiliary layers 140 and 150 are the same, the optical path length 192 a may be determined by the thickness of the photoelectric conversion layer 130. Accordingly, the thickness of the photoelectric conversion layer 130 may be designed differently according to the sensed wavelength of the sensor 100.

For example, the first wavelength spectrum may be a blue wavelength spectrum, and in this case, the photoelectric conversion layer 130 may have a thickness of about 90 nm to about 120 nm. The blue wavelength spectrum may belong, for example, to greater than or equal to about 380 nm and less than about 500 nm, and an absorption peak and an external quantum efficiency peak (EQE peak) of the sensor 100 may exist in the above range. Within the above range, the thickness of the photoelectric conversion layer 130 may be about 90 nm to about 115 nm or about 90 nm to about 110 nm.

For example, the first wavelength spectrum may be a green wavelength spectrum, and in this case, the thickness of the photoelectric conversion layer 130 may be about 20 nm to about 60 nm. The green wavelength spectrum may belong to, for example, about 500 nm to about 600 nm, and the absorption peak and EQE peak of the sensor 100 may exist in the above range. Within the above range, the thickness of the photoelectric conversion layer 130 may be about 25 nm to about 55 nm, about 30 nm to about 50 nm, or about 30 nm to about 45 nm.

For example, the first wavelength spectrum may be a red wavelength spectrum, and in this case, the thickness of the photoelectric conversion layer 130 may be greater than about 60 nm and less than about 90 nm. The red wavelength spectrum may belong to, for example, greater than about 600 nm and less than about 750 nm, and an absorption peak and an EQE peak of the sensor 100 may exist in the above range. Within the above range, the thickness of the photoelectric conversion layer 130 may be about 65 nm to about 85 nm or about 70 nm to about 80 nm.

Due to the first microcavity structure 190*a*, even if the photoelectric conversion layer 130 includes one or more photoelectric conversion materials collectively having no wavelength selectivity (e.g., the photoelectric conversion layer 130 is configured to absorb the entire visible light wavelength spectrum and does not have wavelength selectivity in the visible light wavelength spectrum), the sensor 100 may have wavelength selectivity for selectively sensing light of a first wavelength spectrum selected from a blue wavelength spectrum, a green wavelength spectrum, and a red wavelength spectrum, such that the sensor 100 is configured to selectively sense light of a first wavelength spectrum that is one of a blue wavelength spectrum, a green wavelength spectrum, or a red wavelength spectrum and thus is a limited portion of the visible light wavelength spectrum (e.g., a limited portion of the blue to red wavelength spectrum). As such, the first microcavity structure 190*a* may be a main microcavity structure that determines the sensing wavelength of the sensor 100 (e.g., a particular wavelength spectrum that is a limited portion of the visible wavelength spectrum that the sensor 100 is configured to selectively sense). Accordingly, since the sensor 100 is capable of having high wavelength selectivity without depending on the wavelength selectivity of the one or more photoelectric conversion materials, the selection range of the one or more photoelectric conversion materials may be widened, thereby configuring the sensor 100 to have improved functionality based on having improved wavelength selectivity. The sensor 100 may have such improved wavelength selectivity without including any color filters.

The second microcavity structure 190*b* and/or the third microcavity structure 190*c* may further increase the wavelength selectivity obtained by the first microcavity structure 190*a*, and may modify light of the first wavelength spectrum amplified by the first microcavity structure 190*a* to light of a narrower wavelength spectrum.

The wavelength spectrum modified by the second microcavity structure 190*b* and/or the third microcavity structure 190*c* belongs to the first wavelength spectrum having wavelength selectivity by the first microcavity structure, but may have a full width half maximum (FWHM) narrower than the FWHM of the first wavelength spectrum. The full width at half maximum may be the full width at half maximum of the absorption spectrum or the full width at half maximum of the EQE spectrum. The full width at half maximum of the absorption spectrum may be a width of a wavelength corresponding to half of the absorption intensity at the absorption peak in the absorption spectrum and the full width at half maximum of the EQE spectrum may be a width of a wavelength corresponding to half of an EQE value at an EQE peak in the EQE spectrum. In general, since the absorption spectrum and the EQE spectrum may have the same or extremely similar profiles, if the full width at half maximum of the absorption spectrum is narrowed, the full width at half maximum of the EQE spectrum may also be narrowed.

Modification by the second microcavity structure 190*b* may be determined according to a distance (optical path length 192*b*) between the semi-transmissive electrode 120 and the semi-transmissive auxiliary layer 170, and the distance between the semi-transmissive electrode 120 and the semi-transmissive auxiliary layer 170 may be substantially the same as the thickness of the light transmitting buffer layer 160. The thickness of the light transmitting buffer layer 160 may be designed to be the same or different from each other in the blue wavelength spectrum, the green wavelength spectrum, and the red wavelength spectrum. As described above, for example, the optical path length 192*b* may be about 5 nm to about 50 nm, and within the above range, about 5 nm to about 45 nm, about 5 nm to about 40 nm, about 5 nm to about 35 nm, about 5 nm to about 30 nm, about 10 nm to about 50 nm, about 10 nm to about 45 nm, about 10 nm to about 40 nm, about 10 nm to about 35 nm, or about 10 nm to about 30 nm.

Modification by the third microcavity structure 190*c* may be determined according to a distance (optical path length 192*c*) between the semi-transmissive auxiliary layer 170 and the reflective electrode 110, and the distance between the semi-transmissive auxiliary layer 170 and the reflective electrode 110 may be a sum of thicknesses (e.g., sum of respective thicknesses) of various layers including the photoelectric conversion layer 130 and the light transmitting buffer layer 160.

For example, the first wavelength spectrum may be a blue wavelength spectrum, and in this case, a sum of thicknesses of the photoelectric conversion layer 130 and the light transmitting buffer layer 160 (e.g., a sum of the respective thicknesses of the photoelectric conversion layer 130 and the light transmitting buffer layer 160) may be about 95 nm to about 170 nm, and within the above range, about 100 nm to about 160 nm, or about 110 nm to about 150 nm.

For example, the first wavelength spectrum may be a green wavelength spectrum, and in this case, a sum of thicknesses of the photoelectric conversion layer 130 and the light transmitting buffer layer 160 (e.g., a sum of the respective thicknesses of the photoelectric conversion layer 130 and the light transmitting buffer layer 160) may be about 25 nm to about 110 nm, and within the above range, about 35 nm to about 100 nm, or about 45 nm to about 90 nm.

For example, the first wavelength spectrum may be a red wavelength spectrum, and in this case, a sum of thicknesses of the photoelectric conversion layer 130 and the light transmitting buffer layer 160 (e.g., a sum of the respective thicknesses of the photoelectric conversion layer 130 and the light transmitting buffer layer 160) may be greater than about 65 nm and less than about 140 nm, and within the above range, about 75 nm to about 130 nm, or about 85 nm to about 120 nm.

Considering that the thickness of the photoelectric conversion layer 130 is preferentially determined according to a sensing wavelength of the sensor 100, the modification of the third microcavity structure 190*c* may be mainly determined by the thickness of the light transmitting buffer layer 160, and substantially, the second microcavity structure 190*b* and the third microcavity structure 190*c* may be associated and combined with each other to modify light of the first wavelength spectrum, which is amplified by the first microcavity structure 190*a*, into light of a much narrower wavelength spectrum.

The absorption spectrum and the EQE spectrum of the sensor 100 may have a much narrower full width at half maximum (FWHM) in the first wavelength spectrum by the second and/or third microcavity structures 190*b* and/or 190*c*, for example, the full width at half maximum (FWHM) of the absorption spectrum or the full width at half maximum (FWHM) of the EQE spectrum of the sensor 100 may be about 0.1 to about 0.9, about 0.1 to about 0.8, about 0.1 to about 0.7, about 0.1 to about 0.6, about 0.1 to about 0.5, about 0.2 to about 0.9, about 0.2 to about 0.8, about 0.2 to about 0.7, about 0.2 to about 0.6, about 0.2 to about 0.5, about 0.3 to about 0.9, about 0.3 to about 0.8, about 0.3 to about 0.7, about 0.3 to about 0.6, or about 0.3 to about 0.5 of a full width at half maximum (FWHM) of an absorption spectrum or a full width at half maximum (FWHM) of an EQE spectrum of a sensor having no second and third microcavity structures (e.g., a sensor having the first microcavity structure 190*a* by the reflective electrode 110 and the semi-transmissive electrode 120).

For example, the full width at half maximum (FWHM) of the absorption spectrum or the full width at half maximum (FWHM) of the EQE spectrum in the first wavelength spectrum of the sensor 100 may be less than or equal to about 70 nm and within the range, less than or equal to about 60 nm, less than or equal to about 50 nm, less than or equal to about 45 nm, less than or equal to about 40 nm, about 10 nm to about 70 nm, about 10 nm to about 60 nm, about 10 nm to about 50 nm, about 10 nm to about 45 nm, or about 10 nm to about 40 nm.

In this way, the sensor 100 may structurally have wavelength selectivity regardless of wavelength selectivity characteristics of a photoelectric conversion material of the photoelectric conversion layer 130 and thus may selectively photoelectrically convert light of the first wavelength spectrum, any one of a blue wavelength spectrum, a green wavelength spectrum, or a red wavelength spectrum, due to the aforementioned first microcavity structure 190*a* and further finely modify the first wavelength spectrum due to the aforementioned second and/or third microcavity structures 190*b* and/or 190*c*, thereby exhibiting light absorption characteristics and photoelectric conversion characteristics of a narrower range within the first wavelength spectrum. Accordingly, sensitivity of the sensor 100 may be further improved.

The aforementioned sensor 100 may be used as various sensors requiring photoelectric conversion characteristics, and may be used as, for example, an image sensor, a biometric sensor, or a physical sensor. The image sensor may be a CMOS sensor. The biometric sensor may include, for example, a fingerprint sensor, an iris recognition sensor, a distance sensor, a photoplethysmography (PPG) sensor device, an electroencephalogram (EEG) sensor device, an electrocardiogram (ECG) sensor device, a blood pressure (BP) sensor device, an electromyography (EMG) sensor device, a blood glucose (BG) sensor device, an accelerometer device, a RFID antenna device, an inertial sensor device, an activity sensor device, a strain sensor device, a motion sensor device, or any combination thereof, but is not limited thereto.

Meanwhile, the aforementioned sensor 100 may be arranged on the substrate 10 to form a sensor array. The sensor array may include a plurality of sensors 100 configured to sense light of the same wavelength spectrum or may include a plurality of sensors 100 configured to sense light of different wavelength spectrums.

Figure 2:
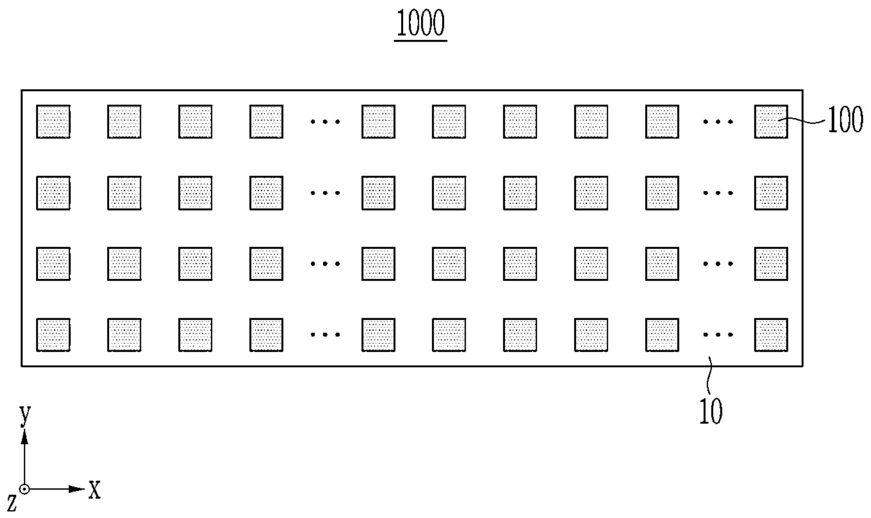
FIG. 2 is a plan view showing an example of a sensor array according to some example embodiments.
Figure 3:
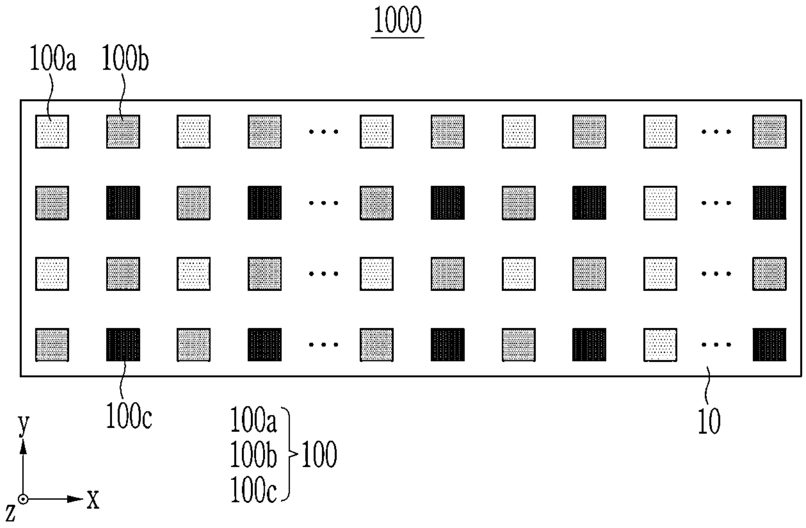
FIG. 3 is a plan view showing another example of a sensor array according to some example embodiments.
Figure 4:
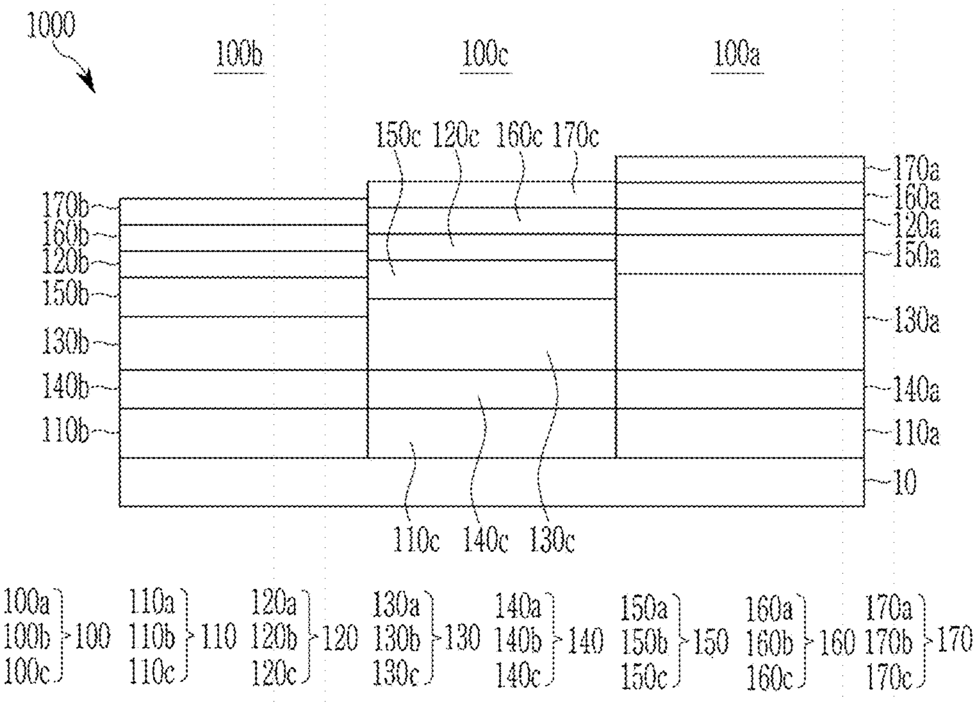
FIG. 4 is a cross-sectional view showing an example of the sensor array of FIG. 3 according to some example embodiments.

FIG. 2 is a plan view showing an example of a sensor array according to some example embodiments, FIG. 3 is a plan view showing another example of a sensor array according to some example embodiments, and FIG. 4 is a cross-sectional view showing an example of the sensor array of FIG. 3.

Referring to FIG. 2, the sensor array 1000 according to some example embodiments includes a plurality of sensors 100 arranged along a row and/or column along an in-plane direction (e.g., xy direction) of the substrate 10 on a substrate 10. However, it is not limited thereto, and the plurality of sensors 100 may be randomly arranged along the in-plane direction of the substrate 10. The plurality of sensors 100 may be configured to sense light of the same wavelength spectrum, and the structure of each sensor 100 is as described above.

For example, in the sensor array 1000, a plurality of sensors 100 configured to sense light of a blue wavelength spectrum may be regularly or randomly arranged along rows and/or columns, and in this case, each sensor 100 may include a reflective electrode 110, a photoelectric conversion layer 130 with a thickness of about 90 nm to about 120 nm, a semi-transmissive electrode 120, a light transmitting buffer layer 160 with a thickness of about 5 nm to about 50 nm, and an semi-transmissive auxiliary layer 170, and may optionally further include first and second charge auxiliary layers 140 and 150, an antireflection layer (not shown), and an encapsulant (not shown). Each sensor 100 may form one pixel or subpixel.

For example, in the sensor array 1000, a plurality of sensors 100 configured to sense light of a green wavelength spectrum may be regularly or randomly arranged along rows and/or columns, and in this case, each sensor 100 may include a reflective electrode 110, a photoelectric conversion layer 130 with a thickness of about 20 nm to 60 nm, a semi-transmissive electrode 120, a light transmitting buffer layer 160 with a thickness of about 5 nm to about 50 nm, and a semi-transmissive auxiliary layer 170, and may optionally further include first and second charge auxiliary layers 140 and 150, an antireflection layer (not shown), and an encapsulant (not shown). Each sensor 100 may form one pixel or subpixel.

For example, in the sensor array 1000, a plurality of sensors 100 configured to sense light of a red wavelength spectrum may be regularly or randomly arranged along rows and/or columns, and in this case, each sensor 100 may include a reflective electrode 110, a photoelectric conversion layer 130 having a thickness greater than about 60 nm and less than 90 nm, a semi-transmissive electrode 120, a light transmitting buffer layer 160 having a thickness of about 5 nm to 50 nm, and a semi-transmissive auxiliary layer 170, and may optionally further include first and second charge auxiliary layers 140 and 150, an antireflection layer (not shown), and an encapsulant (not shown). Each sensor 100 may form one pixel or subpixel.

Referring to FIG. 3, the sensor array 1000 according to some example embodiments includes a plurality of the sensors 100 configured to sense light of different wavelength spectra, wherein the plurality of the sensors 100 may include a blue sensor **100*a* configured to sense light of a blue wavelength spectrum, a green sensor 100*b* configured to sense light of a green wavelength spectrum, and a red sensor 100*c* configured to sense light of a red wavelength spectrum. The blue sensor 100*a*, the green sensor 100*b*, and the red sensor 100*c* are adjacently disposed in relation to one another, wherein each sensor 100*a*, 100*b*, and 100*c*** may form one subpixel or one pixel.

Referring to FIG. 4, each blue sensor **100*a*, green sensor 100*b*, and red sensor 100*c* may include a respective one of the reflective electrodes 110*a*, 110*b*, or 110*c*, a respective one of the photoelectric conversion layers 130*a*, 130*b*, or 130*c*, a respective one of the semi-transmissive electrodes 120*a*, 120*b*, or 120*c*, a respective one of the light transmitting buffer layers 160*a*, 160*b*, or 160*c*, and a respective one of the semi-transmissive auxiliary layers 170*a*, 170*b*, or 170*c* and optionally, further include a respective one of the first charge auxiliary layers 140*a*, 140*b*, or 140*c* and a respective one of the second charge auxiliary layers 150*a*, 150*b*, or 150*c***, an antireflection layer (not shown), and an encapsulant (not shown).

As described above, in the blue sensor **100*a*, the green sensor 100*b*, and the red sensor 100*c*, the photoelectric conversion layers 130*a*, 130*b*, and 130*c* may have a different thickness, for example, the photoelectric conversion layer 130*a* of the blue sensor 100*a* may be thicker than the photoelectric conversion layer 130*c* of the red sensor 100*c* and the photoelectric conversion layer 130*b* of the green sensor 100*b*, and the photoelectric conversion layer 130*c* of the red sensor 100*c* may be thicker than the photoelectric conversion layer 130*b* of the green sensor 100*b*. For example, the photoelectric conversion layer 130*a* of the blue sensor 100*a* may have a thickness of about 90 nm to about 120 nm, the photoelectric conversion layer 130*b* of the green sensor 100*b* may have a thickness of about 20 nm to about 60 nm, and the photoelectric conversion layer 130*c* of the red sensor 100*c*** may have a thickness of greater than about 60 nm and less than about 90 nm.

As described above, the thicknesses of the light transmitting buffer layers **160*a*, 160*b*, and 160*c* in the blue sensor 100*a*, the green sensor 100*b*, and the red sensor 100*c***, respectively, may be the same or different form one another, for example, about 5 nm to about 50 nm, and within the range, about 5 nm to about 45 nm, about 5 nm to about 40 nm, about 5 nm to about 35 nm, about 5 nm to about 30 nm, about 10 nm to about 50 nm, about 10 nm to about 45 nm, about 10 nm to about 40 nm, about 10 nm to about 35 nm, or about 10 nm to about 30 nm.

The aforementioned sensor 100 or sensor array 1000 may be included in a display panel, and may be, for example, a sensor-embedded display panel display panel in which the sensor 100 or sensor array 1000 is embedded in the display panel.

Hereinafter, a display panel including the aforementioned sensor 100 is described.

The display panel according to some example embodiments may be a display panel capable of performing a display function and a recognition function (e.g., biometric recognition function), and may be an in-cell type display panel in which a sensor performing a recognition function (e.g., biometric recognition function) is embedded in the display panel.

Figure 5:
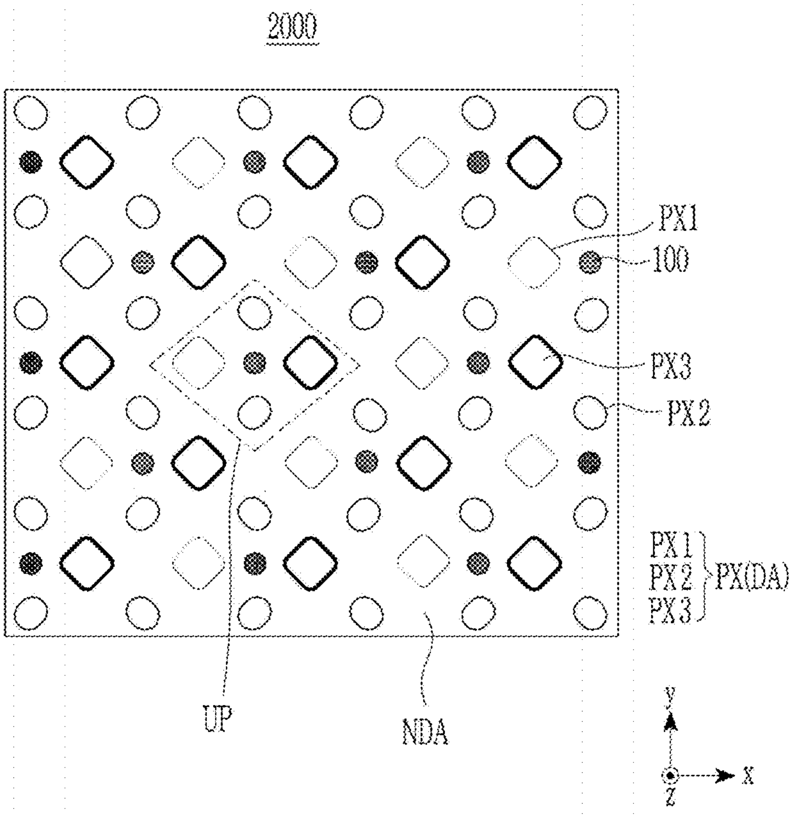
FIG. 5 is a plan view illustrating an example of a display panel according to some example embodiments.
Figure 6:
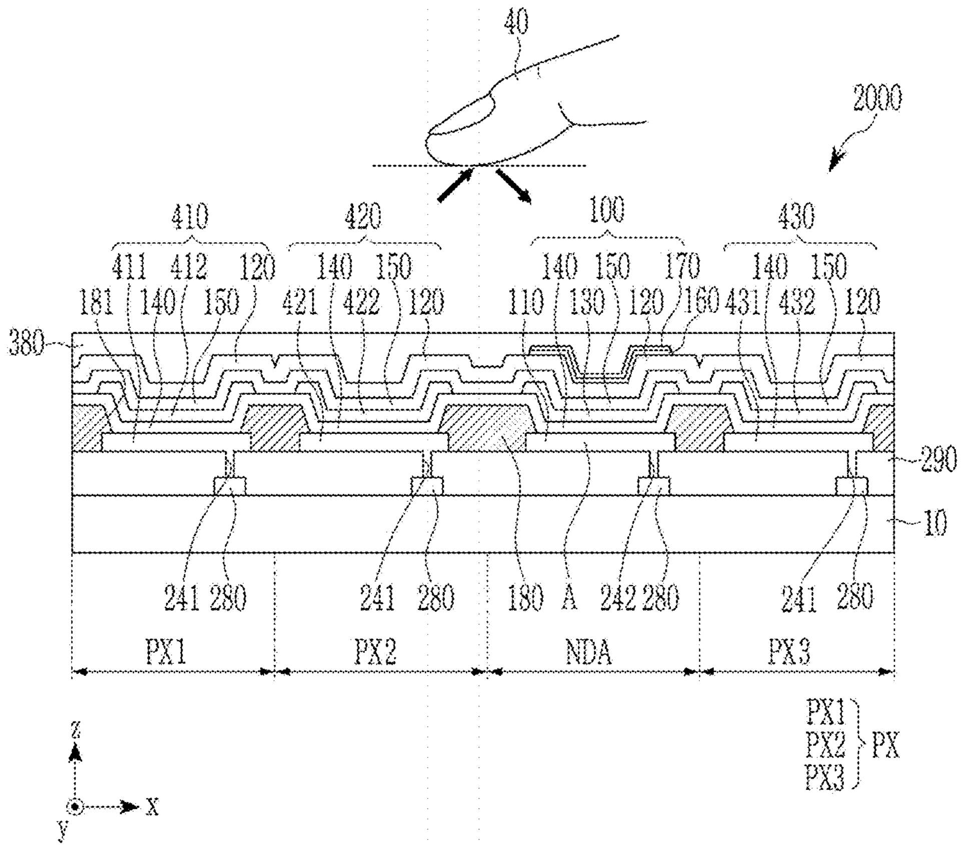
FIG. 6 is a cross-sectional view illustrating an example of a display panel according to some example embodiments.

FIG. 5 is a plan view illustrating an example of a display panel according to some example embodiments, and FIG. 6 is a cross-sectional view illustrating an example of a display panel according to some example embodiments.

Referring to FIGS. 5 and 6, a display panel 2000 according to some example embodiments includes a plurality of subpixels PXs configured to display different colors from each other. The plurality of subpixels PXs may be configured to display at least three primary colors, for example, a first subpixel PX1, a second subpixel PX2, and a third subpixel PX3 configured to display different first color, second color, and third color selected from red, green, and blue. For example, the first color, the second color, and the third color may be blue, green, and red, respectively. The first subpixel PX1 may be a blue subpixel configured to display blue, the second subpixel PX2 may be a green subpixel configured to display green, and the third subpixel PX3 may be a red subpixel configured to display red. However, the present inventive concepts are not limited thereto, and an auxiliary subpixel (not shown) such as a white subpixel may be further included. Displaying a color may refer to emitting light corresponding to the color (e.g., light in a wavelength spectrum of the color). Referring to FIG. 5, the display panel 2000 may include a plurality of first subpixels PX1 configured to display a red color (e.g., light of a red wavelength spectrum) and including a first light emitting element (e.g., the first light emitting element 410 shown in FIG. 6), a plurality of second subpixels PX2 configured to display a green color (e.g., light of a green wavelength spectrum) and including a second light emitting element (e.g., the second light emitting element 420 shown in FIG. 6), and a plurality of third subpixels PX3 configured to display a blue color (e.g., light of a blue wavelength spectrum) and including a third light emitting element (e.g., the third light emitting element 430 shown in FIG. 6), where the first subpixels PX1, the second subpixels PX2, and the third subpixels PX3 are located in and/or at least partially define the display area (DA).

The plurality of subpixels PXs including the first subpixel PX1, the second subpixel PX2, and the third subpixel PX3 may constitute (e.g., define) one unit pixel UP to be arranged repeatedly along the row and/or column. In FIG. 3, a structure including one first subpixel PX1, two second subpixels PX2, and one third subpixel PX3 in the unit pixel UP is illustrated, but the present inventive concepts is not limited thereto. At least one first subpixel PX1, at least one second subpixel PX2, and at least one third subpixel PX3 may be included in the unit pixel UP. In the drawing, as an example, an arrangement of a Pentile type is illustrated, but the present inventive concepts is not limited thereto. The subpixels PXs may be arranged variously. An area occupied by the plurality of subpixels PXs and displaying colors by the plurality of subpixels PXs may be a display area DA displaying an image. For example, the area (e.g., in the xy plane) of the subpixels (PX) may collectively define the display area (DA) that is configured to display an image thereon (e.g., configured to display one or more colors). A portion of the area (e.g., in the xy plane) of the display panel 2000 that excludes the display area (DA) (e.g., portions of the area of the display panel 2000 that are between adjacent subpixels (PX) in the xy direction, xy plane, etc.) may be a non-display area (NDA) that is configured to not display an image thereon (e.g., configured to not display any color).

Each of the first subpixel PX1, the second subpixel PX2, and the third subpixel PX3 may include a light emitting element. As an example, the first subpixel PX1 may include a first light emitting element 410 configured to emit light of a wavelength spectrum of a first color, the second subpixel PX2 may include a second light emitting element 420 configured to emit light of a wavelength spectrum of a second color, and the third subpixel PX3 may include a third light emitting element 430 configured to emit light of a wavelength spectrum of a third color. However, the present inventive concepts are not limited thereto, and at least one of the first subpixel PX1, the second subpixel PX2, or the third subpixel PX3 may include a light emitting element configured to emit light of a combination of a first color, a second color, and a third color, that is, light in a white wavelength spectrum, and may display a first color, a second color, or a third color through a color filter (not shown). Herein, the terms “wavelength spectrum” and “wavelength region” may be used interchangeably.

The display panel 2000 according to some example embodiments includes the aforementioned sensor 100 or sensor array 1000. Each sensor 100 may be disposed in a non-display area NDA. The non-display area NDA may be an area other than the display area DA, in which the first subpixel PX1, the second subpixel PX2, the third subpixel PX3, and optionally auxiliary subpixels are not disposed (e.g., a portion of the total area of the display panel 2000 that excludes the display area (DA), excludes the subpixels (PX), is between adjacent subpixels (PX), etc.). For example, the area (e.g., in the xy plane) of the subpixels (PX) may collectively define the display area (DA) that is configured to display an image thereon (e.g., configured to display one or more colors). A portion of the area (e.g., in the xy plane) of the display panel 2000 that excludes the display area (DA) (e.g., portions of the area of the display panel 2000 that are between adjacent subpixels (PX) in the xy direction, xy plane, etc.) may be a non-display area (NDA) that is configured to not display an image thereon (e.g., configured to not display any color). The sensor 100 may be disposed between at least two subpixels selected from the first subpixel PX1, the second subpixel PX2, and the third subpixel PX3 (e.g., between at least two subpixels of a first subpixel PX1 of a plurality of first subpixels PX1, a second subpixel PX2 of the plurality of second subpixels PX2, or a third subpixel PX3 of the plurality of third subpixels PX3), and may be disposed in parallel with the first, second, and third light emitting elements 410, 420, and 430 in the display area DA, for example at last partially in parallel along the in-plane direction of the substrate 10 (e.g., the xy direction as shown), which may be a direction extending parallel to an upper surface of the substrate 10.

The sensor 100 may be an optical type recognition sensor (e.g., a biometric sensor), and may be configured to absorb light generated by reflection of light emitted from at least one of the first, second or third light emitting elements 410, 420, or 430 in the display area DA, by a recognition target 40 such as a living body, a tool, or an object (e.g., may be configured to absorb light of a red wavelength spectrum, a green wavelength spectrum, a blue wavelength spectrum, an infrared wavelength spectrum, or any combination thereof) to convert it (e.g., the absorbed light) into an electrical signal. Herein, the living body may be a finger, a fingerprint, a palm, an iris, a face, and/or a wrist, but is not limited thereto. The sensor 100 may be, for example, a fingerprint sensor, an illumination sensor, an iris sensor, a distance sensor, a blood vessel distribution sensor, and/or a heart rate sensor, but is not limited thereto.

The sensor 100 may be in the same plane as the first, second, and third light emitting elements 410, 420, and 430 on the substrate 10, and may be embedded in the display panel 2000. For example, the display panel 2000 may have a structure in which a light emitting element array including the first, second, and third light emitting elements 410, 420, and 430 and the aforementioned sensor array 1000 are disposed on the same plane. Restated, the sensor 100 may be at least partially in parallel with the first, second, and third light emitting elements 410, 420, and 430 on the substrate 10 along an in-plane direction of the substrate 10. As described herein, the in-plane direction of the substrate 10 may be a direction (e.g., the xy direction as shown) that extends in parallel with at least a portion of the substrate 10, including an upper surface of the substrate 10.

Referring to FIG. 6, the display panel 2000 includes a substrate 10; a thin film transistor 280 on the substrate 10; an insulation layer 290 on thin film transistor 280; a pixel definition layer 180 on the insulation layer 290; and first, second, or third light emitting elements 410, 420, or 430 and the sensor 100 in a space partitioned by (e.g., at least partially defined by) the pixel definition layer 180.

The substrate 10 may support the display panel, and may be, for example, a light transmitting substrate such as a glass plate or a polymer substrate.

A plurality of thin film transistors 280 are formed on the substrate 10. One or more thin film transistors 280 may be included in each subpixel PX, and may include, for example, at least one switching thin film transistor and/or at least one driving thin film transistor. The substrate 10 on which the thin film transistor 280 is formed may be a thin film transistor substrate (TFT substrate) or a thin film transistor backplane (TFT backplane).

The insulation layer 290 may cover the substrate 10 and the thin film transistor 280 and may be formed on the whole (e.g., entire) surface of the substrate 10. The insulation layer 290 may be a planarization layer or a passivation layer, and may include an organic insulating material, an inorganic insulating material, an organic-inorganic insulating material, or any combination thereof. The insulation layer 290 may have a plurality of contact holes 241 for connecting the first, second, and third light emitting elements 410, 420, and 430 and the thin film transistor 280 and a plurality of contact holes 242 for electrically connecting the sensor 100 and the thin film transistor 280. The insulation layer 290 may include an organic, inorganic, or organic-inorganic insulating material, in some example embodiments, an inorganic insulating material such as silicon oxide, silicon nitride, silicon oxynitride, aluminum oxide, aluminum nitride, or aluminum oxynitride; an organic insulating material such as polyimide, polyamide, polyamideimide, or polyacrylate; or an organic-inorganic insulating material such as polyorganosiloxane or polyorganosilazane.

The pixel definition layer 180 may also be formed on the whole surface of the substrate 10 and may be disposed between adjacent subpixels PX's to partition each subpixel PX. The pixel definition layer 180 may have a plurality of openings 181 in each subpixel PX, and in each opening 181, any one of first, second, or third light emitting elements 410, 420, or 430 and the sensor 100 may be disposed. The pixel definition layer 180 may include an insulation layer that may include an organic, inorganic, or organic-inorganic insulating material, in some example embodiments, an inorganic insulating material such as silicon oxide, silicon nitride, or silicon oxynitride; an organic insulating material such as polyimide; or an organic-inorganic insulating material such as polyorganosiloxane or polyorganosilazane.

The first, second and third light emitting elements 410, 420, and 430 are formed on the substrate 10 (or thin film transistor substrate), and are repeatedly arranged along the in-plane direction (e.g., xy direction) of the substrate 10 (also referred to as an in-plane direction of the substrate 10). As described above, the first, second, and third light emitting elements 410, 420, and 430 may be included in the first subpixel PX1, the second subpixel PX2, and the third subpixel PX3, respectively. The first, second, and third light emitting elements 410, 420, and 430 may be electrically connected to separate thin film transistors 280 and may be driven independently.

The first, second and third light emitting elements 410, 420, and 430 may be configured to each independently emit light of a blue wavelength spectrum, a green wavelength spectrum, a red wavelength spectrum, or any combination thereof. For example, the first light emitting element 410 may be configured to emit light of a blue wavelength spectrum, the second light emitting element 420 may be configured to emit light of a green wavelength spectrum, and the third light emitting element 430 may be configured to emit light of a red wavelength spectrum. Herein, the blue wavelength spectrum, the green wavelength spectrum, and the red wavelength spectrum may have a peak emission wavelength ($\lambda_{peak,L}$) in a wavelength region of greater than or equal to about 380 nm and less than about 500 nm, about 500 nm to about 600 nm, and greater than about 600 nm and less than about 750 nm, respectively.

The first, second, and third light emitting elements 410, 420, and 430 may be, for example, light emitting diodes, for example, an organic light emitting diode including an organic material, an inorganic light emitting diode including an inorganic material, a quantum dot light emitting diode including quantum dots, or a perovskite light emitting diode including perovskite.

The sensor 100 may be formed on the substrate 10 (or the thin film transistor substrate), and may be randomly or regularly arranged along the in-plane direction (e.g., xy direction) of the substrate 10. As described above, the sensor 100 may be disposed in the non-display area NDA, and may be connected to a separate thin film transistor 280 to be independently driven. The sensor 100 may be configured to absorb light of the same wavelength spectrum as the light emitted from at least one of the first, second, or third light emitting elements 410, 420, or 430 to convert the absorbed light into an electrical signal. For example, the sensor 100 may be configured to absorb light of a blue wavelength spectrum, a green wavelength spectrum, a red wavelength spectrum, or any combination thereof to convert the absorbed light into an electrical signal.

Each of the first, second, and third light emitting elements 410, 420, and 430 and the sensor 100 may include a separate, respective pixel electrode of the pixel electrodes 411, 421, 431, and 110; a separate portion of a common electrode 120 facing the pixel electrodes 411, 421, 431, and 110 and to which a common voltage is applied; and a separate, respective light emitting layer 412, 422, and 432 or a photoelectric conversion layer 130, a separate portion of a first common auxiliary layer 140, and a separate portion of a second common auxiliary layer 150 between the pixel electrodes 411, 421, 431, and 110 and the common electrode 120. The pixel electrode 110 of the sensor 100 may correspond to the reflective electrode 110 of the aforementioned sensor 100, the common electrode 120 of the sensor 100 may correspond to the semi-transmissive electrode 120 of the aforementioned sensor 100, and the first and second common auxiliary layers 140 and 150 may correspond to the first and second charge auxiliary layers 140 and 150 of the aforementioned sensor 100.

The first, second, and third light emitting elements 410, 420, and 430 and the sensor 100 may be arranged at least partially in parallel along the in-plane direction (e.g., xy direction) of the substrate 10, and the common electrode 120, the first common auxiliary layer 140, and the second common auxiliary layer 150 which are formed on the whole surface may be shared. For example, as shown in at least FIG. 6, the photoelectric conversion layer 130 of the sensor 100 and the light emitting layers 412, 422, and 432 of the first, second, and third light emitting elements 410, 420, and 430 may at least partially overlap with each other (e.g., partially or completely overlap each other) in the in-plane direction (e.g., xy direction) of the substrate 10, which may be understood to be a horizontal direction that extends in parallel to an in-plane direction of the substrate 10 as shown in FIG. 6 and/or a horizontal direction that extends in parallel to an upper surface of the substrate 10 as shown in FIG. 6, and the photoelectric conversion layer 130 and the light emitting layers 412, 422, and 432 may be at least partially positioned on the same plane (e.g., an xy plane extending in the xy directions that intersects each of the photoelectric conversion layer 130 and the light emitting layers 412, 422, and 432).

The common electrode 120 is continuously formed as a single piece of material that extends on the light emitting layers 412, 422, and 432 and the photoelectric conversion layer 130, and is substantially formed on the whole surface of the substrate 10. The common electrode 120 may apply a common voltage to the first, second, and third light emitting elements 410, 420, and 430 and the sensor 100. As shown, the first, second, and third light emitting elements 410, 420, and 430 and the sensor 100 may include separate portions of a single common electrode 120 that is a single piece of material that extends on each of the respective light emitting layers 412, 422, and 432 and the photoelectric conversion layer 130 and between the first, second, and third light emitting elements 410, 420, and 430 and the sensor 100.

The first common auxiliary layer 140 is between the pixel electrodes 411, 421, 431, and 110 and the light emitting layers 412, 422, 432, and the photoelectric conversion layer 130, and may be continuously formed as a single piece of material that extends on the pixel electrodes 411, 421, 431, and 110, and under the light emitting layers 412, 422, and 432 and the photoelectric conversion layer 130. As shown, the first, second, and third light emitting elements 410, 420, and 430 and the sensor 100 may include separate portions of a single first common auxiliary layer 140 that is a single piece of material that extends on the pixel electrodes 411, 421, 431, and 110, and under the light emitting layers 412, 422, and 432 and the photoelectric conversion layer 130.

The first common auxiliary layer 140 may be a charge auxiliary layer (e.g., hole auxiliary layer) that facilitates injection and/or transport of charge carriers (e.g., holes) from the pixel electrodes 411, 421, and 431 to the light emitting layers 412, 422, and 432. For example, the HOMO energy level of the first common auxiliary layer 140 may be between the HOMO energy level of the light emitting layers 412, 422, and 432 and the work function of the pixel electrodes 411, 421, 431. The work function of the pixel electrodes 411, 421, and 431, the HOMO energy level of the first common auxiliary layer 140, and the HOMO energy level of the light emitting layers 412, 422, and 432 may be sequentially deepened.

The first common auxiliary layer 140 may include an organic material, an inorganic material, an organic-inorganic material, or any combination thereof satisfying the HOMO energy level, for example a phthalocyanine compound such as copper phthalocyanine; DNTPD (N,N'-diphenyl-N,N'-bis-[4-(phenyl-m-tolyl-amino)-phenyl]-biphenyl-4,4'-diamine), m-MTDATA (4,4',4"-[tris(3-methylphenyl)phenylamino] triphenylamine), TDATA (4,4'4"-tris(N,N-diphenylamino)triphenylamine), 2-TNATA (4,4',4"-tris{N-(2-naphthalen-2-yl)-N-phenylamino}-triphenylamine), PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/Camphor sulfonic acid), PANI/PSS (polyaniline/poly(4-styrenesulfonate)), NPB (N,N'-di(naphthalene-1-yl)-N,N'-diphenylbenzidine), polyetherketone including triphenylamine (TPAPEK), 4-isopropyl-4'-methyldiphenyliodonium[tetrakis(pentafluorophenyl)borate], HAT-CN (dipyrazino[2,3-f: 2',3'-h] quinoxaline-2,3,6,7,10,11-hexacarbonitrile), a carbazole-based derivative such as N-phenylcarbazole, polyvinylcarbazole, and the like, a fluorene-based derivative, TPD (N,N'-bis(3-methylphenyl)-N,N'-diphenyl-[1,1-biphenyl]-4,4'-diamine), a triphenylamine-based derivative such as TCTA (4,4',4"-tris(N-carbazolyl)triphenylamine), NPB (N,N'-di(naphthalene-1-yl)-N,N'-diphenyl-benzidine), TAPC (4,4'-cyclohexylidene bis[N,N-bis(4-methylphenyl)benzenamine]), HMTPD (4,4'-bis[N,N'-(3-tolyl)amino]-3,3'-dimethylbiphenyl), mCP (1,3-bis(N-carbazolyl)benzene), or any combination thereof, but is not limited thereto. The first common auxiliary layer 140 may be one layer or two or more layers.

The second common auxiliary layer 150 may be disposed between the light emitting layers 412, 422, and 432 and the photoelectric conversion layer 130 and the common electrode 120. The second common auxiliary layer 150 may be continuously formed as a single piece of material that extends on the light emitting layers 412, 422, and 432 and the photoelectric conversion layer 130 and under the common electrode 120. As shown, the first, second, and third light emitting elements 410, 420, and 430 and the sensor 100 may include separate portions of a single second common auxiliary layer 150 that is a single piece of material that on each of the light emitting layers 412, 422, and 432 and the photoelectric conversion layer 130 and under the common electrode 120.

The second common auxiliary layer 150 may be an auxiliary charge layer (e.g., an electron auxiliary layer) that facilitates injection and/or transport of charges (e.g., electrons) from the common electrode 120 to the light emitting layers 412, 422, and 432. For example, a LUMO energy level of the second common auxiliary layer 150 may be between a LUMO energy level of the light emitting layers 412, 422, and 432 and a work function of the common electrode 120, and the work function of the common electrode 120, the LUMO energy level of the second common auxiliary layer 150, and the LUMO energy levels of the light emitting layers 412, 422, and 432 may become sequentially shallow.

The second common auxiliary layer 150 may include an organic material, an inorganic material, an organic-inorganic material, or any combination thereof satisfying the LUMO energy level, for example a halogenated metal such as LiF, NaCl, CsF, RbCl, and RbI; a lanthanides metal such as Yb; a metal oxide such as $Li_2O$ or BaO; Liq (lithium quinolate), Alq3 (tris(8-hydroxyquinolinato)aluminum), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzoimidazolyl-1-ylphenyl)-9,10-dinaphthylanthracene, TPBi (1,3,5-tri(1-phenyl-1H-benzo[d]imidazol-2-yl)phenyl), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tertbutylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1, O8)-(1,1'-biphenyl-4-olato)aluminum), $Bebq_2$ (beryllium bis (benzoquinolin-10-olate), ADN (9,10-di(naphthalene-2-yl) anthracene), BmPyPhB (1,3-bis[3,5-di(pyridin-3-yl)phenyl] benzene), or any combination thereof, but is not limited thereto. The second common auxiliary layer 150 may be one layer or two or more layers.

Each of the first, second, and third light emitting elements 410, 420, and 430 and the sensor 100 include pixel electrodes 411, 421, 431, and 110, respectively, which face the common electrode 120. One of the pixel electrodes 411, 421, 431, and 110 or the common electrode 120 is an anode and the other is a cathode. For example, the pixel electrodes 411, 421, 431, and 110 may be anodes and the common electrode 120 may be a cathode. The pixel electrodes 411, 421, 431, and 110 are separated for each subpixel PX and are electrically connected to separate thin film transistors 280 to be independently driven.

The pixel electrode 411, 421, 431, and 110 may each be reflective electrodes and the common electrode 120 may be a semi-transmissive electrode. The reflective electrode may include a reflective layer and the semi-transmissive electrode may include a semi-transmissive layer. As described above, since the pixel electrodes 411, 421, 431, and 110 and the common electrode 120 are a pair of a reflective layer and a semi-transmissive layer, the aforementioned first microcavity structure may be formed.

For example, among the light emitted from the light emitting layers 412, 422, and 432 of the first, second, and third light emitting elements 410, 420, and 430, light of a particular (or, alternatively, predetermined) wavelength spectrum may be repeatedly reflected between the semi-transmissive electrode and the reflective electrode and then may be modified. Among the modified light, light of a wavelength spectrum corresponding to a resonance wavelength of a microcavity may be enhanced to exhibit amplified light emission characteristics in a narrow wavelength region. Accordingly, the display panel 2000 may express colors with high color purity.

For example, among the light incident on the sensor 100, light of a particular (or, alternatively, predetermined) wavelength spectrum may be repeatedly reflected between the semi-transmissive electrode and the reflective electrode to be modified. Among the modified light, light having a wavelength spectrum corresponding to the resonance wavelength of a microcavity may be enhanced to exhibit photoelectric conversion characteristics amplified in a narrow wavelength region. Accordingly, the sensor 100 may exhibit high photoelectric conversion characteristics in a narrow wavelength region. Details are as described above.

Each of the first, second, and third light emitting elements 410, 420, and 430 includes light emitting layers 412, 422, and 432 between the pixel electrodes 411, 421, and 431 and the common electrode 120. Each of the light emitting layer 412 included in the first light emitting element 410, the light emitting layer 422 included in the second light emitting element 420, and the light emitting layer 432 included in the third light emitting element 430 may be configured to emit light in the same or different wavelength spectra and may be configured to emit light in, for example a blue wavelength spectrum, a green wavelength spectrum, a red wavelength spectrum, or any combination thereof.

For example, when the first light emitting element 410, the second light emitting element 420, and the third light emitting element 430 may be a blue light emitting elements, a green light emitting element, and a red light emitting element, respectively, the light emitting layer 412 may be a blue light emitting layer configured to emit light in a blue wavelength spectrum, the light emitting layer 422 included in the second light emitting element 420 may be a green light emitting layer configured to emit light in a green wavelength spectrum, and the light emitting layer 432 included in the third light emitting element 430 may be a red light emitting layer configured to emit light in a red wavelength spectrum. Herein, the blue wavelength spectrum, the green wavelength spectrum, and the red wavelength spectrum may have a peak emission wavelength in a wavelength region of greater than or equal to about 380 nm and less than about 500 nm, about 500 nm to about 600 nm, and greater than about 600 nm and less than about 750 nm, respectively.

For example, when at least one of the first light emitting element 410, the second light emitting element 420, or the third light emitting element 430 is a white light emitting element, the light emitting layer of the white light emitting element may be configured to emit light of a visible light wavelength spectrum, for example, light in a wavelength spectrum of greater than or equal to about 380 nm and less than about 750 nm, about 380 nm to about 700 nm, or about 400 nm to about 700 nm.

The light emitting layers 412, 422, and 432 may include an organic light emitter, a quantum dot, a perovskite, or any combination thereof as a light emitter. For example, the light emitting layers 412, 422, and 432 may include an organic light emitter, and may include at least one host material and a fluorescent or phosphorescent dopant.

The organic light emitting body may include perylene; rubrene; 4-(dicyanomethylene)-2-methyl-6-[p-(dimethylamino)styryl]-4H-pyran; coumarin or a derivative thereof; carbazole or a derivative thereof; TPBi (2,2',2"-(1,3,5-benzinetriyl)-tris(1-phenyl-1-H-benzimidazole); TBADN (2-t-butyl-9,10-di(naphth-2-yl)anthracene); AND (9,10-di(naphthalene-2-yl)anthracene); CBP (4,4'-bis(N-carbazolyl)-1,1'-biphenyl); TCTA (4,4',4"-tris(carbazol-9-yl)-triphenylamine); TPBi (1,3,5-tris(N-phenylbenzimidazol-2-yl)benzene); TBADN (3-tert-butyl-9,10-di(naphth-2-yl) anthracene); DSA (distyrylarylene); CDBP (4,4'-bis(9-carbazolyl)2,2'-dimethylbiphenyl); MADN (2-methyl-9,10-bis(naphthalen-2-yl)anthracene); TCP (1,3,5-tris(carbazol-9-yl)benzene); Alq3 (tris(8-hydroxyquinolino)lithium); an organometallic compound including Pt, Os, Ti, Zr, Hf, Eu, Tb, Tm, Rh, Ru, Re, Be, Mg, Al, Ca, Mn, Co, Cu, Zn, Ga, Ge, Pd, Ag and/or Au, a derivative thereof, or any combination thereof, but is not limited thereto.

The quantum dot may include, for example, a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or any combination thereof. The Group II-IV semiconductor compound may be, for example, selected from a binary semiconductor compound selected from CdSe, CdTe, ZnS, ZnSe, ZnTe, ZnO, HgS, HgSe, HgTe, MgSe, MgS, or any mixture thereof; a ternary semiconductor compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or any mixture thereof; and a quaternary semiconductor compound selected from HgZnTeS, CdZnSeS, CdZnSeTe, CdZnSTe, CdHgSeS, CdHgSeTe, CdHgSTe, HgZnSeS, HgZnSeTe, HgZnSTe, or any mixture thereof, but is not limited thereto. The Group III-V semiconductor compound may be, for example, selected from a binary semiconductor compound selected from GaN, GaP, GaAs, GaSb, AlN, AlP, AlAs, AlSb, InN, InP, InAs, InSb, or any mixture thereof; a ternary semiconductor compound selected from GaNP, GaNAs, GaNSb, GaPAs, GaPSb, AlNP, AlNAs, AlNSb, AlPAs, AlPSb, InNP, InNAs, InNSb, InPAs, InPSb, or any mixture thereof; and a quaternary semiconductor compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any mixture thereof, but is not limited thereto. The Group IV-VI semiconductor compound may be, for example, selected from a binary semiconductor compound selected from SnS, SnSe, SnTe, PbS, PbSe, PbTe, or any mixture thereof; a ternary semiconductor compound selected from SnSeS, SnSeTe, SnSTe, PbSeS, PbSeTe, PbSTe, SnPbS, SnPbSe, SnPbTe, or any mixture thereof;

and a quaternary semiconductor compound selected from SnPbSSe, SnPbSeTe, SnPbSTe, or any mixture thereof, but is not limited thereto. The Group IV semiconductor compound may be, for example, selected from a single-element semiconductor compound such as Si, Ge, or any mixture thereof; and a binary element compound selected from SiC, SiGe, or any mixture thereof, but is not limited thereto. The Group I-III-VI semiconductor compound may be, for example, $CuInSe_2$, $CuInS_2$, CuInGaSe, CuInGaS, or any mixture thereof, but is not limited thereto. The Group I-II-IV-VI semiconductor compound may be, for example, CuZnSnSe, CuZnSnS, or any mixture thereof, but is not limited thereto. The Group II-III-V semiconductor compound may be, for example, InZnP, but is not limited thereto.

The perovskite may be $CH_3NH_3PbBr_3$, $CH_3NH_3PbI_3$, $CH_3NH_3SnBr_3$, $CH_3NH_3SnI_3$, $CH_3NH_3Sn_{1x}Pb_xBr_3$ ($0<x<1$), $CH_3NH_3Sn_{1x}Pb_xI_3$, $HC(NH_2)_2PbI_3$, $HC(NH_2)_2SnI_3$, $(C_4H_9NH_3)_2PbBr_4$, $(C_6H_5CH_2NH_3)_2PbBr_4$, $(C_6H_5CH_2NH_3)_2PbI_4$, $(C_6H_5C_2H_4NH_3)_2PbBr_4$, $(C_6H_{13}NH_3)_2(CH_3NH_3)_{n1}Pb_nI_{3n+1}$ (n is a natural number), or any combination thereof, but is not limited thereto.

The sensor 100 includes a photoelectric conversion layer 130 between the pixel electrode 110 and the common electrode 120. The photoelectric conversion layer 130 is in parallel with the light emitting layers 412, 422, and 432 of the first, second, and third light emitting elements 410, 420, and 430 along the in-plane direction (e.g., xy direction) of the substrate 10. The photoelectric conversion layer 130 and the light emitting layers 412, 422, and 432 may be disposed on the same plane.

The photoelectric conversion layer 130 may be configured to absorb light and convert the absorbed light into an electrical signal. The photoelectric conversion layer 130 may be configured to absorb light emitted from at least one of the first, second, or third light emitting elements 410, 420, or 430 and then reflected by the recognition target 40, and convert the absorbed light into an electrical signal. The photoelectric conversion layer 130, as described above, may include one or two or more photoelectric conversion materials configured to absorb light and convert the absorbed light into electrical signals, wherein one photoelectric conversion material or a combination of the two or more photoelectric conversion materials may, for example, absorb light in a blue to red wavelength spectrum, that is, a visible light wavelength spectrum (greater than or equal to about 380 nm and less than about 750 nm) and then, photoelectrically convert it.

In other words, the one or more photoelectric conversion materials included in the photoelectric conversion layer 130 may be configured to absorb light of the blue to red wavelength spectra (e.g., greater than or equal to about 380 nm and less than about 750 nm, about 380 nm to about 700 nm, or about 400 nm to about 700 nm) and photoelectrically convert it and thus have no wavelength selectivity within the visible light wavelength spectrum. Accordingly, the one or more photoelectric conversion materials are not particularly limited, as long as they may be configured to absorb light within the visible light wavelength spectrum, and selection of materials may be widened without limitation of wavelength selectivity.

Furthermore, since the sensor 100 shares the first common auxiliary layer 140 and the second common auxiliary layer 150 adjacent to the photoelectric conversion layer 130 with the first, second, and third light emitting elements 410, 420, and 430, wherein the photoelectric conversion layer 130 is limited to match energy levels (HOMO energy level and/or LUMO energy level) of the first common auxiliary layer 140 and the second common auxiliary layer 150, but according to some example embodiments, since the one or more photoelectric conversion materials included in the photoelectric conversion layer 130 have no substantial limitation in terms of the wavelength selectivity, selection of the materials matchable with the energy levels (HOMO energy level and/or LUMO energy level) of the first common auxiliary layer 140 and the second common auxiliary layer 150 may be widened.

A thickness of the photoelectric conversion layer 130 may vary according to a wavelength spectrum to be sensed by the sensor 100. For example, the sensor 100 may be a blue sensor configured to selectively sense light in a blue wavelength spectrum, a green sensor configured to selectively sense light in a green wavelength spectrum, or a red sensor configured to selectively sense light in a red wavelength spectrum, and the photoelectric conversion layer 130 may have different thicknesses in the blue sensor, the green sensor, and the red sensor.

For example, each sensor 100 may be a blue sensor, and the photoelectric conversion layer 130 may have a thickness of about 90 nm to about 120 nm.

For example, each sensor 100 may be a green sensor, and the photoelectric conversion layer 130 may have a thickness of about 20 nm to about 60 nm.

For example, each sensor 100 may be a red sensor, and the thickness of the photoelectric conversion layer 130 may be greater than about 60 nm and less than 90 nm.

The sensor 100 includes a light transmitting buffer layer 160 and a semi-transmissive auxiliary layer 170 on the common electrode 120. As described above, the light transmitting buffer layer 160 and the semi-transmissive auxiliary layer 170 may implement the second and/or third microcavity structure for modifying the wavelength selectivity of the sensor 100, and a detailed description thereof is as described above. The light transmitting buffer layer 160 and the semi-transmissive auxiliary layer 170 may be selectively disposed in the sensor 100, and thus may be disposed in an island shape only in the region where the sensor 100 is disposed.

An encapsulation layer 380 is formed on the first, second, and third light emitting elements 410, 420, 430, and the sensor 100. The encapsulation layer 380 may include, for example, a glass plate, a metal thin film, an organic layer, an inorganic layer, an organic/inorganic layer, or any combination thereof. The organic layer may include, for example, an acrylic resin, a (meth)acrylic resin, polyisoprene, a vinyl resin, an epoxy resin, a urethane resin, a cellulose resin, a perylene resin, or any combination thereof, but is not limited thereto. The inorganic layer may include, for example, oxide, nitride, and/or oxynitride, for example, silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or any combination thereof, but is not limited thereto. The organic/inorganic layer may include, for example, polyorganosiloxane but is not limited thereto. The encapsulation layer 380 may have one layer or two or more layers.

As described above, the display panel 2000 according to some example embodiments includes the first, second, and third light emitting elements 410, 420, and 430 configured to emit light of a particular (or, alternatively, predetermined) wavelength spectrum to display colors, and the sensor 100 configured to absorb light generated by reflection of the light, by the recognition target 40 and convert it into an electrical signal, in the same plane on the substrate 10, thereby performing a display function and a recognition function (e.g., biometric recognition function) together. Accordingly, unlike conventional display panels formed on the outside of the display panel or formed under the display panel by manufacturing the sensor as a separate module, it may improve performance without increasing the thickness, implementing a slim-type high performance display panel 2000.

In addition, since the sensor 100 uses light emitted from the first, second, and/or third light emitting elements 410, 420, and 430, the recognition function (e.g., biometric recognition function) may be performed without a separate light source. Therefore, it is not necessary to provide a separate light source outside the display panel 2000, thereby reducing or preventing a decrease in the aperture ratio of the display panel due to the area occupied by the light source, and at the same time saving power consumed by the separate light source to improve power consumption of the display panel 2000.

In addition, as described above, the first, second, and third light emitting elements 410, 420, and 430 and the sensor 100 share the common electrode 120, the first common auxiliary layer 140, and the second common auxiliary layer 150, and thus the structure and process may be simplified compared with the case where the first, second, and third light emitting elements 410, 420, and 430 and the sensor 100 are formed in separate processes, thereby enabling the display panel 2000 to be manufactured with reduced manufacturing costs and/or process complexity (which thereby reduces the likelihood of manufacturing process defects in the display panel 2000 and thus improves the reliability of the manufactured display panel 2000).

In addition, the sensor 100 may be an organic sensor including an organic photoelectric conversion layer, and accordingly, the sensor 100 may have a light absorbance that is two or more times higher than that of an inorganic diode such as a silicon photodiode, performing a high-sensitivity sensing function with further thinner thickness.

In addition, the sensor 100 may be disposed anywhere in the non-display area NDA, they may be disposed at a desired location of the display panel 2000 as many as desired. Accordingly, for example, by randomly or regularly disposing the sensor 100 or sensor array 1000 on the entire display panel 2000, the biometric function may be performed on any portion of the screen of an electronic device such as a mobile device, and according to the user's selection, the biometric function may be selectively performed at a specific location where the biometric function is required.

Figure 7:
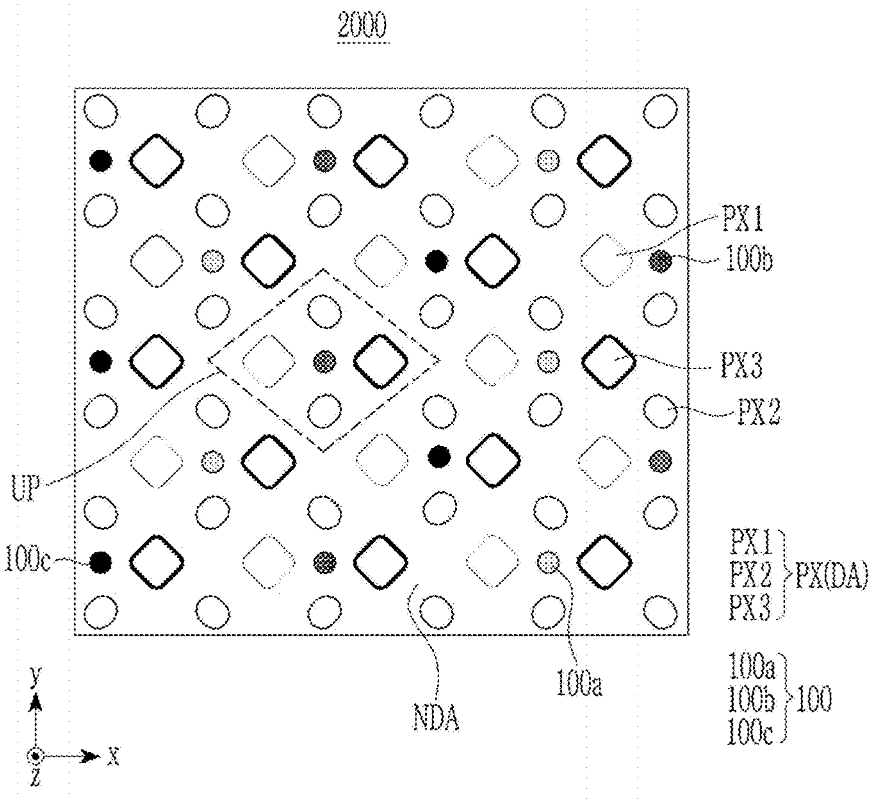
FIG. 7 is a plan view illustrating another example of a display panel according to some example embodiments.
Figure 8:
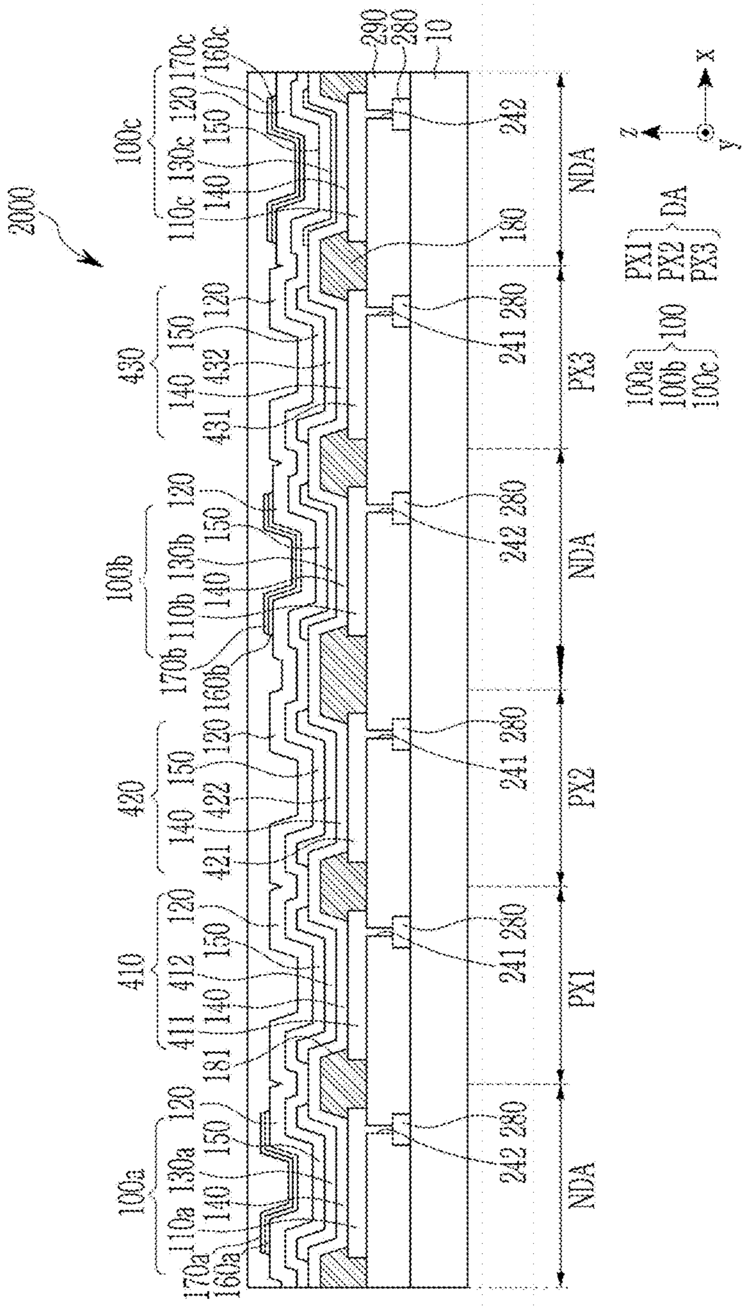
FIG. 8 is a cross-sectional view showing another example of a display panel according to some example embodiments.

FIG. 7 is a plan view illustrating another example of a display panel according to some example embodiments and FIG. 8 is a cross-sectional view showing another example of a display panel according to some example embodiments.

Referring to FIGS. 7 and 8, the display panel 2000 according to some example embodiments includes a first subpixel PX1, a second subpixel PX2, and a third subpixel PX3 displaying different colors as in some example embodiments, including the example embodiments shown in FIGS. 5-6, each of the first subpixel PX1, the second subpixel PX2, and the third subpixel PX3 may include first, second, and third light emitting elements 410, 420, and 430, and the sensor 100 may be disposed on the same plane as the plurality of first, second, and third light emitting elements 410, 420, and 430 on the substrate 10. The descriptions of the first, second and third light emitting elements 410, 420 and 430 are as described above.

In the display panel 2000 according to some example embodiments, unlike some example embodiments, including the example embodiments shown in FIGS. 5-6, the sensor 100 includes the blue sensor 100*a*, the green sensor 100*b*, and the red sensor 100*c* configured to sense light of different wavelength spectra. The blue sensor 100*a*, the green sensor 100*b*, and the red sensor 100*c* may be alternately arranged along a column and/or row of the substrate 10 and surrounded with at least one first light emitting element 410, at least one second light emitting element 420, and at least one third light emitting element 430. The blue sensor 100*a*, the green sensor 100*b*, and the red sensor 100*c* may be disposed in each non-display area (NDA).

The blue sensor 100*a*, the green sensor 100*b*, or the red sensor 100*c* may be configured to absorb light generated by reflection of light of a blue spectrum, green spectrum, or red spectrum emitted from the first, second, or third light emitting element 410, 420, and 430 by a recognition target 40 such as a living body, a tool, or an object to convert it into an electrical signal.

Each blue sensor 100*a*, green sensor 100*b*, and red sensor 100*c* may include a separate, respective pixel electrode 110*a*, 110*b*, and 110*c*, a separate, respective photoelectric conversion layer 130*a*, 130*b*, and 130*c*, a separate portion of the first common auxiliary layer 140, a separate portion of the second common auxiliary layer 150, and a separate portion of the common electrode 120, a separate light transmitting buffer layer 160*a*, 160*b*, and 160*c*, and a separate semi-transmissive auxiliary layer 170*a*, 170*b*, and 170*c*, wherein the common electrode 120, the first common auxiliary layer 140, and the second common auxiliary layer 150 are shared with the first, second, and third light emitting elements 410, 420, and 430. Each blue sensor 100*a*, green sensor 100*b*, and red sensor 100*c* may not include any color filter that is configured to selectively transmit blue light, green light, or red light, respectively, to the respective photoelectric conversion layer 130*a*, 130*b*, and 130*c* of the blue sensor 100*a*, green sensor 100*b*, and red sensor 100*c*.

As described above, in the blue sensor 100*a*, the green sensor 100*b*, and the red sensor 100*c*, the photoelectric conversion layers 130*a*, 130*b*, and 130*c* may have a different thickness one another, for example, the photoelectric conversion layer 130*a* of the blue sensor 100*a* may be thicker than the photoelectric conversion layer 130*c* of the red sensor 100*c* and the photoelectric conversion layer 130*b* of the green sensor 100*b*, and the photoelectric conversion layer 130*c* of the red sensor 100*c* may be thicker than the photoelectric conversion layer 130*b* of the green sensor 100*b*. For example, the thickness of the photoelectric conversion layer 130*a* of the blue sensor 100*a* may be about 90 nm to about 120 nm, the thickness of the photoelectric conversion layer 130*b* of the green sensor 100*b* may be about 20 nm to about 60 nm, and the thickness of the photoelectric conversion layer 130*c* of the red sensor 100*c* may be greater than about 60 nm and less than about 90 nm.

As described above, in the blue sensor 100*a*, the green sensor 100*b*, and the red sensor 100*c*, the light transmitting buffer layers 160*a*, 160*b*, and 160*c* may have a different or the same thickness, for example, a thickness of about 5 nm to about 50 nm and within the range, about 5 nm to about 45 nm, about 5 nm to about 40 nm, about 5 nm to about 35 nm, about 5 nm to about 30 nm, about 10 nm to about 50 nm, about 10 nm to about 45 nm, about 10 nm to about 40 nm, about 10 nm to about 35 nm, or about 10 nm to about 30 nm. Detailed descriptions of the blue sensor 100*a*, the green sensor 100*b*, and the red sensor 100*c* are the same as described above.

The aforementioned display panel 2000 may be applied to electronic devices such as various display devices. Electronic devices such as display devices may be applied to, for example, mobile phones, video phones, smart phones, mobile phones, smart pads, smart watches, digital cameras, tablet PCs, laptop PCs, notebook computers, computer monitors, wearable computers, televisions, digital broadcasting terminals, e-books, personal digital assistants (PDAs), portable multimedia player (PMP), enterprise digital assistant (EDA), head mounted display (HMD), vehicle navigation, Internet of Things (IoT), Internet of all things (IoE), drones, door locks, safes, automatic teller machines (ATM), security devices, medical devices, or automotive electronic components, but are not limited thereto.

Figure 9:
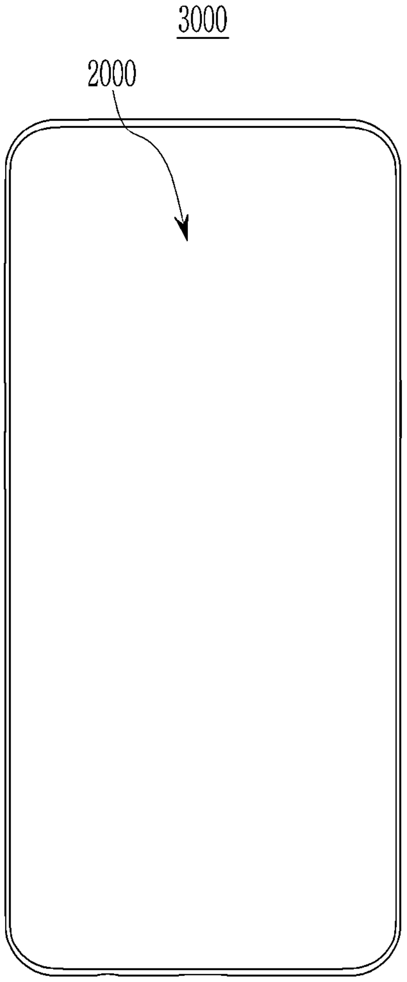
FIG. 9 is a schematic view illustrating an example of a smart phone as an electronic device according to some example embodiments.

FIG. 9 is a schematic view illustrating an example of a smart phone as an electronic device according to some example embodiments.

Referring to FIG. 9, the electronic device 3000 may include the aforementioned display panel 2000, the display panel 2000 having the sensor 100 on the whole or a portion of the area of the display panel 2000, and thus a biometric recognition function may be performed on any portion of the screen, and according to the user's selection, the biometric recognition function may be selectively performed only at a specific location where the biometric recognition function is required.

An example of a method of recognizing the recognition target 40 in an electronic device 3000 such as a display device may include, for example, driving the first, second, and third light emitting elements 410, 420, and 430 of the display panel 2000 and the sensor 100 to detect the light reflected from the recognition target 40 among the light emitted from the first, second, and third light emitting elements 410, 420, and 430, in the sensor 100 or sensor array 1000; comparing the image of the recognition target 40 stored in advance with the image of the recognition target 40 detected by the sensor 100 or sensor array 1000; and judging the consistency of the compared images and if they match according to the determination that recognition of the recognition target 40 is complete, turning off the sensor 100 or sensor array 1000, permitting user's access to the display device, and driving the display panel 2000 to display an image.

Figure 10:
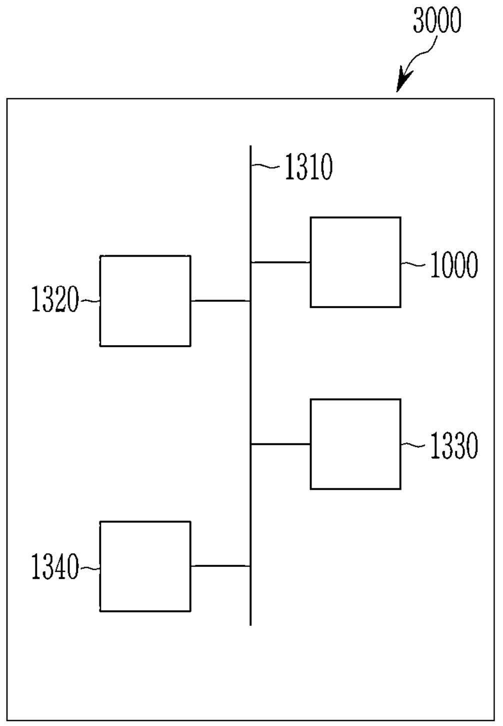
FIG. 10 is a schematic view illustrating an example of a configuration view of an electronic device according to some example embodiments.

FIG. 10 is a schematic view illustrating an example of a configuration view of an electronic device according to some example embodiments.

Referring to FIG. 10, in addition to the aforementioned constituent elements (e.g., the display panel 2000), the electronic device 3000 may further include a bus 1310, a processor 1320, a memory 1330, and at least one additional device 1340. Information of the aforementioned display panel 2000, processor 1320, memory 1330, and at least one additional device 1340 may be transmitted to each other through the bus 1310.

The processor 1320 may include one or more articles (e.g., units, instances, etc.) of processing circuitry such as a hardware including logic circuits; a hardware/software combination such as processor-implemented software; or any combination thereof. For example, the processing circuitry may be a central processing unit (CPU), an arithmetic logic unit (ALU), a digital signal processor, a microcomputer, a field programmable gate array (FPGA), System-on-Chip (SoC), a programmable logic unit, a microprocessor, an application-specific integrated circuit (ASIC), and the like. As an example, the processing circuitry may include a non-transitory computer readable storage device. The processor 1320 may, for example, control a display operation of the display panel 2000 or control a sensor operation of the sensor 100 (or sensor array 1000).

The memory 1330 may be a non-transitory computer readable storage medium, such as, for example, as a solid state drive (SSD) and may store an instruction program (e.g., program of instructions), and the processor 1320 may perform a function related to the display panel 2000 by executing the stored instruction program.

The at least one additional device 1340 may be one or more communication interfaces (e.g., wireless communication interfaces, wired interfaces), user interfaces (e.g., keyboard, mouse, buttons, etc.), power supply and/or power supply interfaces, or any combination thereof.

The units and/or modules described herein may be implemented using hardware constituent elements and software constituent elements. The units and/or modules described herein may include, may be included in, and/or may be implemented by one or more articles of processing circuitry such as a hardware including logic circuits; a hardware/software combination such as processor-implemented software; or any combination thereof. For example, the processing circuitry may be a central processing unit (CPU), an arithmetic logic unit (ALU), a digital signal processor, a microcomputer, a field programmable gate array (FPGA), System-on-Chip (SoC), a programmable logic unit, a microprocessor, an application-specific integrated circuit (ASIC), and the like. For example, the hardware constituent elements may include microphones, amplifiers, band pass filters, audio-to-digital converters, and processing devices. The processing device may be implemented using one or more hardware devices configured to perform and/or execute program code by performing arithmetic, logic, and input/output operations. The processing device may include a processor, a controller and an arithmetic logic unit, a digital signal processor, a microcomputer, a field programmable array, a programmable logic unit, a microprocessor, or any other device capable of responding to and executing instructions. The processing device may access, store, operate, process, and generate data in response to execution of an operating system (OS) and one or more software running on the operating system.

The software may include a computer program, a code, an instruction, or any combination thereof, and may transform a processing device for a special purpose by instructing and/or configuring the processing device independently or collectively to operate as desired. The software and data may be implemented permanently or temporarily as signal waves capable of providing or interpreting instructions or data to machines, parts, physical or virtual equipment, computer storage media or devices, or processing devices. The software may also be distributed over networked computer systems so that the software may be stored and executed in a distributed manner. The software and data may be stored by one or more non-transitory computer readable storage devices.

The method according to any of the example embodiments may be recorded in a non-transitory computer readable storage device including program instructions for implementing various operations of any of the example embodiments. The storage device may also include program instructions, data files, data structures, and the like alone or in combination. The program instructions recorded in the storage device may be specially designed for some example embodiments or may be known to those skilled in computer software and available for use. Examples of non-transitory computer-readable storage devices may include magnetic media such as hard disks, floppy disks, and magnetic tapes;

optical media such as CD-ROM discs, DVDs and/or blue-ray discs; magneto-optical media such as optical disks; and a hardware device configured to store and execute program instructions such as ROM, RAM, flash memory, and the like. The aforementioned device may be configured to operate as one or more software modules to perform the operations of any of the example embodiments.

The aforementioned sensor 100 or sensor array 1000 may also be applied to an optical communication device as an example of an electronic device.

Figure 11:
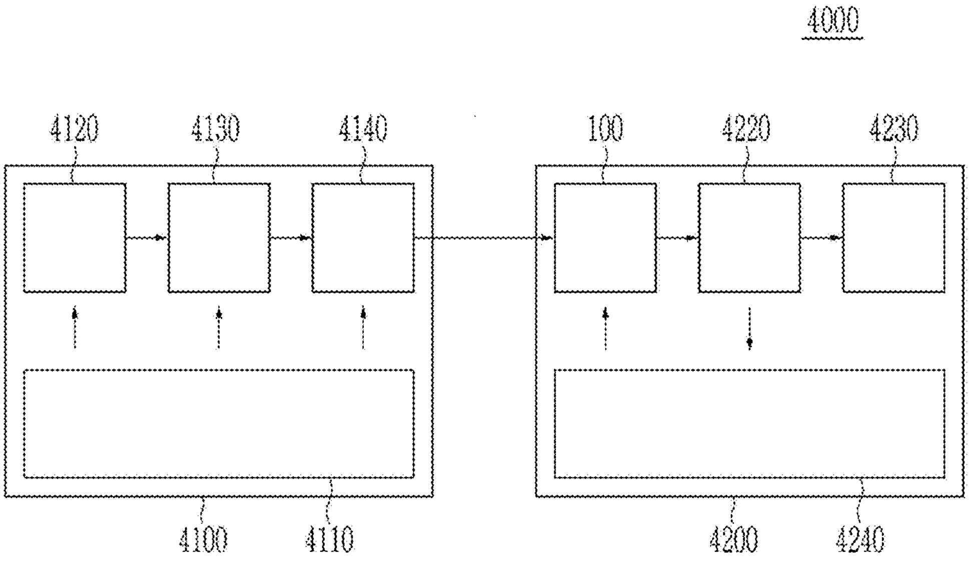
FIG. 11 is a schematic view showing an example of an optical communication device as an electronic device according to some example embodiments.

FIG. 11 is a schematic view showing an example of an optical communication device as an electronic device according to some example embodiments.

Referring to FIG. 11, the optical communication device 4000 according to some example embodiments may include a transmitter 4100 and a receiver 4200. The transmitter 4100 may include a controller 4110, an encoder 4120, a pre-equalizer 4130, and a driver 4140. The receiver 4200 may include the aforementioned sensor 100 (or the sensor array 1000), a machine learning demodulator 4220, a decoder 4230, and a signal-to-interference and noise ratio (SINR) estimator 4240.

The controller 4110 of the transmitter 4100 may determine transmission parameters for encoding, equalization, and optical signal driving and then, transmit the determined transmission parameters to the encoder 4120, the pre-equalizer 4130, and the driver 4140. The transmission parameters determined by the controller 4110 may include a modulation level for encoding, an equalization parameter for pre-equalization, and a modulation depth for driving optical signals. For example, when feedback of the estimated SINR of the received signals is received from the receiver 4200, the controller 4110 may adjust the modulation level, the equalization parameter, and the modulation depth based on the received SINR feedback and transfer the adjusted modulation level, the equalization parameter, and the modulation depth to the encoder 4120, the pre-equalizer 4130, and the driver 4140.

The encoder 4120 of the transmitter 4100 may generate an encoded signal by encoding a bit string, which will be transmitted to the receiver 4200, according to the modulation level determined by the controller 4110 and thus generate the encoded signals. The pre-equalizer 4130 of the transmitter 4100 may compensate for the reception characteristic of the sensor 100 by reinforcing a partial frequency band of the encoded signals. The pre-equalizer 4130 may reinforce a band corresponding to the reinforcement bandwidth (i.e., the pre-equalization parameter) determined by the controller 4110 in the encoded signals. The pre-equalizer 4130 may pre-equalize the optical signals based on a particular (or, alternatively, predetermined) equalization bandwidth (i.e., equalization parameter) and then, re-equalize the optical signals (i.e., re-pre-equalization) according to an equalization bandwidth adjusted based on the SINR feedback from the receiver 4200.

The driver 4140 of the transmitter 4100 may modulate an electrical signal according to a modulation depth determined by the controller 4110 and drive the modulated signal to a light source (LED, a laser, or the like). Subsequently, in the light source, the optical signal driven by the driver 4140 may be output.

The sensor 100 of the receiver 4200 may be configured to convert light received from the transmitter 4100 to electrical signals. The sensor 100 may be configured to sequentially or simultaneously convert light of different wavelength spectra into electrical signals. When the light of different wavelength spectra is sequentially received by the receiver 4200, the sensor 100 may generate electrical signal according to each wavelength spectrum through the photoelectric conversion layer 130 corresponding to each wavelength spectrum. Or when the light of different wavelength spectra simultaneously reaches the receiver 4200, the sensor 100 may generate electrical signals according to each wavelength spectrum through the photoelectric conversion layer 130 corresponding to each wavelength spectrum. The sensor 100 has the same as described above and may have further improved wavelength selectivity due to a combination of a plurality of the microcavity structures, resultantly exhibiting high sensitivity.

The sensor 100 may be included as the sensor array 1000 including the blue sensor 100*a*, the green sensor 100*b*, and the red sensor 100*c* configured to sense light of different wavelength spectra, and FIGS. 3 and 4 show a specific structure is thereof.

An ML demodulator 4220 of the receiver 4200 may demodulate the original signal from the electrical signal converted by the sensor 100 by using an ML model trained through sample data. A decoder 4230 of the receiver 4200 may decode bits from the demodulated electric signal. The SINR estimator 4240 of the receiver 4200 may estimate the SINR of the optical signal from the demodulated electrical signal and feedback the estimated SINR to the transmitter 4100, the sensor 100, or the like.

Hereinafter, some example embodiments are illustrated in more detail with reference to examples. However, the scope of the inventive concepts is not limited to such examples.

Manufacture of Blue Sensor

Example 1-1

Al (10 nm), ITO (100 nm), and Al (8 nm) are sequentially deposited on the glass substrate to form a reflective electrode (work function: 4.9 eV) having an Al/ITO/Al structure. Subsequently, N,N'-bis(3-methylphenyl)-N,N'-diphenyl-[1,1-biphenyl]-4,4'-diamine is deposited on the reflective electrode to form a hole auxiliary layer (HOMO: 5.3 eV to 5.6 eV, LUMO: 2.0 eV to 2.3 eV). Subsequently, Compound A and C60 are co-deposited on the hole auxiliary layer to form a 90 nm-thick photoelectric conversion layer (absorption wavelength range: 380 nm to 700 nm).

Then, 4,7-diphenyl-1,10-phenanthroline is deposited on the photoelectric conversion layer to form an electron auxiliary layer (HOMO: 6.1 to 6.4 eV, LUMO: 2.9 to 3.2 eV). Then, magnesium (Mg) and silver (Ag) are co-deposited on the electron auxiliary layer to form a 15 nm-thick semi-transmissive electrode. Subsequently, HT211 is deposited on the semi-transmissive electrode to form a 30 nm-thick light transmitting buffer layer, and magnesium (Mg) and silver (Ag) are co-deposited thereon to form a 15 nm-thick semi-transmissive auxiliary layer, manufacturing a sensor.

[Compound A]

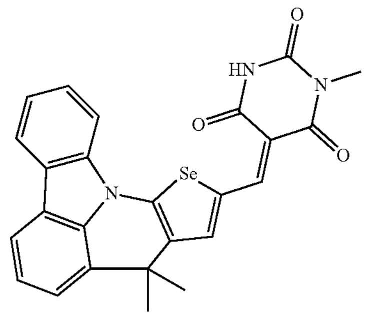

Example 1-2

A sensor is manufactured in the same manner as in Example 1-1 except that a 95 nm-thick photoelectric conversion layer is formed instead of the 90 nm-thick photoelectric conversion layer.

Example 1-3

A sensor is manufactured in the same manner as in Example 1-1 except that a 100 nm-thick photoelectric conversion layer is formed instead of the 90 nm-thick photoelectric conversion layer.

Manufacture of Green Sensor

Example 2-1

A sensor is manufactured in the same manner as in Example 1-1 except that a 30 nm-thick photoelectric conversion layer is formed instead of the 90 nm-thick photoelectric conversion layer.

Example 2-2

A sensor is manufactured in the same manner as in Example 2-1 except that a 35 nm-thick photoelectric conversion layer is formed instead of the 30 nm-thick photoelectric conversion layer.

Example 2-3

A sensor is manufactured in the same manner as in Example 2-1 except that a 40 nm-thick photoelectric conversion layer is formed instead of the 30 nm-thick photoelectric conversion layer.

Manufacture of Red Sensor

Example 3-1

A sensor is manufactured in the same manner as in Example 1-1 except that a 70 nm-thick photoelectric conversion layer is formed instead of the 90 nm-thick photoelectric conversion layer.

Example 3-2

A sensor is manufactured in the same manner as in Example 3-1 except that a 75 nm-thick photoelectric conversion layer is formed instead of the 70 nm-thick photoelectric conversion layer.

Example 3-3

A sensor is manufactured in the same manner as in Example 3-1 except that an 80 nm-thick photoelectric conversion layer is formed instead of the 70 nm-thick photoelectric conversion layer.

Evaluation

The sensors according to Examples 1-1 to 1-3, 2-1 to 2-3, and 3-1 to 3-3 are evaluated with respect to optical electrical characteristics.

The optical electrical characteristics are evaluated by measuring an external quantum efficiency (EQE) peak ($\lambda_{peak,EQE}$) of an EQE spectrum, EQE at the EQE peak, and a full width at half maximum (FWHM) at blue (450 nm, B), green (530 nm, G), and red (630 nm, R) wavelengths at 3 V by using an incident photon to current efficiency (IPCE) equipment.

The results are shown in Tables 1 to 3.

TABLE 1

| | EQE peak ($\lambda_{peak, EQE}$, nm) | EQE (%, @$\lambda_{peak, EQE}$) | EQE full width at half maximum (FWHM) (nm) |
|---|---|---|---|
| Example 1-1 | 450 | 25 | 34 |
| Example 1-2 | 455 | 25 | 37 |
| Example 1-3 | 470 | 22 | 43 |

TABLE 2

| | EQE peak ($\lambda_{peak, EQE}$, nm) | EQE (%, @$\lambda_{peak, EQE}$) | EQE full width at half maximum (FWHM) (nm) |
|---|---|---|---|
| Example 2-1 | 530 | 30 | 55 |
| Example 2-2 | 555 | 28 | 63 |
| Example 2-3 | 565 | 29 | 68 |

TABLE 3

| | EQE peak ($\lambda_{peak, EQE}$, nm) | EQE (%, @$\lambda_{peak, EQE}$) | EQE full width at half maximum (FWHM) (nm) |
|---|---|---|---|
| Example 3-1 | 630 | 26 | 34 |
| Example 3-2 | 635 | 25 | 38 |
| Example 3-3 | 645 | 23 | 31 |

Referring to Tables 1 to 3, the sensors according to Examples 1-1 to 1-3, 2-1 to 2-3, and 3-1 to 3-3 have a narrow full width at half maximum (FWHM) and thus high wavelength selectivity. Accordingly, the sensors according to Examples 1-1 to 1-3, 2-1 to 2-3, and 3-1 to 3-3 may exhibit high sensitivity.

While the inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

What is claimed is:

1. A sensor, comprising:

a reflective electrode, a photoelectric conversion layer on the reflective electrode, the photoelectric conversion layer including one or more photoelectric conversion materials, a semi-transmissive electrode on the photoelectric conversion layer, a light transmitting buffer layer on the semi-transmissive electrode, and a semi-transmissive auxiliary layer on the light transmitting buffer layer, wherein the semi-transmissive auxiliary layer includes a metal layer having a light transmittance of about 10% to about 70% and a reflectance of about 30% to about 80%.

2. The sensor of claim 1, wherein the one or more photoelectric conversion materials includes one photoelectric conversion material that is configured to absorb light in a blue to red wavelength spectrum, or a combination of two or more photoelectric conversion materials, the combination configured to absorb light in the blue to red wavelength spectrum, and the sensor is configured to selectively sense light of a first wavelength spectrum that is any one of a blue wavelength spectrum, a green wavelength spectrum, or a red wavelength spectrum.

3. The sensor of claim 2, wherein the first wavelength spectrum is the blue wavelength spectrum, and a thickness of the photoelectric conversion layer is about 90 nm to about 120 nm.

4. The sensor of claim 3, wherein a sum of thicknesses of the photoelectric conversion layer and the light transmitting buffer layer is about 95 nm to about 170 nm.

5. The sensor of claim 2, wherein the first wavelength spectrum is the green wavelength spectrum, and a thickness of the photoelectric conversion layer is about 20 nm to about 60 nm.

6. The sensor of claim 5, wherein a sum of thicknesses of the photoelectric conversion layer and the light transmitting buffer layer is about 25 nm to about 110 nm.

7. The sensor of claim 2, wherein the first wavelength spectrum is the red wavelength spectrum, and the photoelectric conversion layer has a thickness of greater than about 60 nm and less than about 90 nm.

8. The sensor of claim 7, wherein a sum of thicknesses of the photoelectric conversion layer and the light transmitting buffer layer is greater than about 65 nm and less than about 140 nm.

9. The sensor of claim 1, wherein the light transmitting buffer layer is non-conductive and is configured to not absorb light in a visible light wavelength spectrum, and refractive indices of the light transmitting buffer layer at 450 nm, 530 nm, and 630 nm are about 1.3 to about 2.0, respectively.

10. The sensor of claim 1, wherein a thickness of the light transmitting buffer layer is about 5 nm to about 50 nm.

11. A sensor array comprising the sensor of claim 1.

12. A sensor array, comprising:

a first sensor configured to selectively sense light in a blue wavelength spectrum, a second sensor configured to selectively sense light in a green wavelength spectrum, and a third sensor configured to selectively sense light in a red wavelength spectrum, wherein the first sensor, the second sensor, and the third sensor each include a reflective electrode, a photoelectric conversion layer on the reflective electrode, a semi-transmissive electrode on the photoelectric conversion layer, a light transmitting buffer layer on the semi-transmissive electrode, and a semi-transmissive auxiliary layer on the light transmitting buffer layer, and wherein the photoelectric conversion layer of the first sensor, the photoelectric conversion layer of the second sensor, and the photoelectric conversion layer of the third sensor have different thicknesses from each other.

13. The sensor array of claim 12, wherein the photoelectric conversion layer of the first sensor is thicker than the photoelectric conversion layer of the third sensor, and the photoelectric conversion layer of the third sensor is thicker than the photoelectric conversion layer of the second sensor.

14. The sensor array of claim 13, wherein a thickness of the photoelectric conversion layer of the first sensor is about 90 nm to about 120 nm, a thickness of the photoelectric conversion layer of the second sensor is about 20 nm to about 60 nm, and a thickness of the photoelectric conversion layer of the third sensor is greater than 60 nm and less than 90 nm.

15. The sensor array of claim 12, wherein a sum of thicknesses of the photoelectric conversion layer and the light transmitting buffer layer of the first sensor is about 95 nm to about 170 nm, a sum of thicknesses of the photoelectric conversion layer and the light transmitting buffer layer of the second sensor is about 25 nm to about 110 nm, and a sum of the photoelectric conversion layer and the light transmitting buffer layer of the third sensor is greater than about 65 nm and less than 140 nm.

16. The sensor array of claim 12, wherein each photoelectric conversion layer of the first sensor, the second sensor, and the third sensor includes one or more photoelectric conversion materials, and the one or more photoelectric conversion materials includes one photoelectric conversion material that is configured to absorb light in a blue to red wavelength spectrum, or a combination of two or more photoelectric conversion materials, the combination configured to absorb light in the blue to red wavelength spectrum.

17. A sensor array, comprising:

a first sensor, a second sensor, and a third sensor repeatedly arranged on a substrate, wherein the first sensor, the second sensor, and the third sensor each include a photoelectric conversion layer configured to absorb light in a blue to red wavelength spectrum, wherein the first sensor, the second sensor, and the third sensor each do not include any color filter, wherein the first sensor is configured to selectively sense light in a blue wavelength spectrum, wherein the second sensor is configured to selectively sense light in a green wavelength spectrum, wherein the third sensor is configured to selectively sense light in a red wavelength spectrum, and each of full widths at half maximum of EQE spectra of the first sensor, the second sensor, and the third sensor is about 10 nm to about 70 nm.

18. The sensor array of claim 17, wherein each of the first sensor, the second sensor and the third sensor further include a reflective electrode under the photoelectric conversion layer, and a semi-transmissive electrode, a light transmitting buffer layer, and a semi-transmissive auxiliary layer on the photoelectric conversion layer, wherein the photoelectric conversion layer of the first sensor is thicker than the photoelectric conversion layer of the third sensor, wherein the photoelectric conversion layer of the third sensor is thicker than the photoelectric conversion layer of the second sensor, wherein a sum of thicknesses of the photoelectric conversion layer of the first sensor and the light transmitting buffer layer of the first sensor is about 95 nm to about 170 nm, wherein a sum of thicknesses of the photoelectric conversion layer of the second sensor and the light transmitting buffer layer of the second sensor is about 25 nm to about 110 nm, and wherein a sum of thicknesses of the photoelectric conversion layer of the third sensor and the light transmitting buffer layer of the third sensor is greater than about 65 nm and less than about 140 nm.

19. A display panel, comprising:

the sensor array according to claim 11, and a light emitting element array comprising a light emitting element configured to display blue light, a light emitting element configured to display green light, and a light emitting element configured to display red light.

20. An electronic device, comprising the sensor array according to claim 11.

* * * * *